United States Patent
Hashimoto et al.

(10) Patent No.: US 7,176,752 B2
(45) Date of Patent: Feb. 13, 2007

(54) PLATE VOLTAGE GENERATION CIRCUIT CAPABLE CONTROLLING DEAD BAND

(75) Inventors: Takeshi Hashimoto, Tokyo (JP); Hiromitsu Kojima, Tokyo (JP)

(73) Assignees: Elpida Memory, Inc., Tokyo (JP); Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 402 days.

(21) Appl. No.: 10/878,486

(22) Filed: Jun. 29, 2004

(65) Prior Publication Data

US 2005/0040804 A1    Feb. 24, 2005

(30) Foreign Application Priority Data

Jun. 30, 2003    (JP) .............................. 2003-186499

(51) Int. Cl.
*G05F 1/10* (2006.01)
(52) U.S. Cl. ..................................... 327/541
(58) Field of Classification Search ................ 327/541, 327/561, 562, 563
See application file for complete search history.

(56) References Cited

U.S. PATENT DOCUMENTS 6,201,378 B1 *   3/2001   Eto et al. ..................... 323/313
6,339,318 B1 *   1/2002   Tanaka ........................ 323/313
6,781,443 B2 *   8/2004   Hamamoto et al. ......... 327/541
6,798,276 B2 *   9/2004   Mori et al. .................. 327/541

FOREIGN PATENT DOCUMENTS

JP          6-338188          12/1994

* cited by examiner

Primary Examiner—Jeffrey Zweizig
(74) Attorney, Agent, or Firm—McGinn IP Law Group, PLLC

(57) ABSTRACT

A plate voltage generation circuit comprises: first and second differential circuits (11a, 11b) supplied with a reference voltage ($V_{REF}$) and an output voltage ($V_{OUT}$), respectively; a push-pull output circuit (3), connected to the first and second differential circuits, for generating the output voltage; and first and second dead-band control circuits, connected to the first and second differential circuits, respectively, for changing the width of a dead band of the output voltage in accordance with a high level or a low level of dead-band control signals (Sa, Sb) externally supplied.

11 Claims, 17 Drawing Sheets

PLATE VOLTAGE GENERATION CIRCUIT CAPABLE CONTROLLING DEAD BAND

BACKGROUND OF THE INVENTION

1. Field of the Invention

The present invention relates to plate voltage generation circuits. In detail, the present invention relates to a plate voltage generation circuit capable of setting a dead band in an output voltage when an output circuit generates the output voltage, that is half an external power supply voltage $V_{DD}$. Particularly, the present invention relates to a plate voltage generation circuit capable of changing the width of a dead band into an arbitrary different value.

2. Description of the Related Art

Controlling a dead band in the above-mentioned kind of plate voltage generation circuit is used in order to suppress a through current in a push-pull output circuit. The push-pull output circuit is provided for a circuit for generating a voltage used as a cell plate voltage of a cell capacitor and a voltage used as a precharge voltage for a bit line.

A plurality of techniques for suppressing such a through current are known. According to those techniques, however, a dead band is set in order to always restrict the through current, generated in an output circuit, to a predetermined value or lower. The through current is generated when the dead band disappears due to manufacturing variations.

In the known dead-band control, as compared with an operating current of the order of milliamperes (mA), the through current differs from the operating current by an order of amplitude. That is, the through current is negligible in chip operation. Further controlling the through current interferes with stabilization of voltage level supplied to the above plate voltage generation circuit. From this viewpoint, the dead band is not widened more than necessary. When a refresh current of 1 to 3 mA, which is conventionally set, is reduced to 100 μA or lower in order to achieve ultra-low current consumption, however, the through current becomes a problem. For example, a dynamic random access memory (DRAM) requires refresh operation to hold written data. The refresh operation means that data is again read from the memory within refresh time serving as the maximum data hold time and is then rewritten.

Referring to FIG. 1, for example, the refresh time is the sum of refresh operation time T1 and data hold time T2. A refresh current is obtained by an expression of (I1·T1+I2·T2)/(T1+T2), where I1 denotes operating current upon rewriting, T1 denotes rewrite time, I2 denotes standby current for data hold time, and T2 denotes the data hold time.

The refresh current can be reduced by extending the data hold time using a process improvement and a circuit technique such as a data correction technique. Extending the data hold time results in an increase in proportion of the time T2 in FIG. 1. As a result, the through current of several tens of μA in the current I2 is not negligible. When the width of the dead band is wider than the conventional one in order to reduce the through current of several tens of μA generated in the data hold operation, however, response speed of the push-pull output circuit decreases. Disadvantageously, a voltage level becomes unstable. With the above points as background, we consider voltage generation circuits capable of suppressing a very small through current in the data hold operation without deteriorating the characteristics of the known voltage generation circuit. Then, the present invention is realized.

Japanese Unexamined Patent Application Publication No. 6-338188 (hereinbelow, referred to as Document 1) discloses an example of this kind of voltage generation circuit. In this voltage generation circuit, a through current can be reduced in an output buffer circuit serving as a push-pull output circuit. Further, the width of a dead band of an output voltage can be freely set. The voltage generation circuit can also be applied to devices with an SOI (silicon-on-insulator) structure.

Referring to FIG. 2, the voltage generation circuit includes a reference potential (or voltage) generation circuit 111, a pair of shift circuits 112a and 112b, and an output buffer circuit 113. The reference potential generation circuit 111 includes resistors R11, R12, and R13 to generate two different reference potentials (voltages). The pair of shift circuits 112a and 112b shift the two reference potentials by a predetermined level, respectively. The shift circuit 112a has transistors Q11, Q12, Q13, and Q14. The shift circuit 112b has transistors Q15, Q16, Q17, and Q18. The output buffer circuit 113 includes a pair of source follower transistors (hereinbelow, simply referred to as transistors) Q19 and Q20 having opposite conductivities. Voltages shifted by the pair of shift circuits 112a and 112b are applied to the respective gates of the transistors Q19 and Q20.

A power supply voltage as an external power supply voltage is designated by reference symbol $V_{CC}$. In the reference potential generation circuit 111, the resistances of the resistors R11, R12, and R13 are set properly. The reference potential generation circuit 111 generates two reference potentials $[(V_{CC}/2)+\Delta V]$ and $[(V_{CC}/2)-\Delta V]$. The two reference potentials are shifted by the pair of shift circuits 112a and 112b, respectively. The output buffer circuit 113 receives the shifted voltages and generates an output voltage of $V_{CC}/2$.

In this voltage generation circuit, the dead band can be set around $V_{CC}/2$ in the output voltage. Thus, the through current does not flow in a series circuit composed of the transistors Q19 and Q20. When the respective resistances of the resistors R11, R12, and R13 to produce two reference potentials are varied in the reference potential generation circuit 111, the width of the dead band can be freely controlled.

Document 1 also discloses an example in which the drive capability of an output buffer circuit component can be changed in two levels corresponding to output voltages. FIG. 3 shows the structure of a voltage generation circuit according to this example.

Referring to FIG. 3, the voltage generation circuit has a reference potential generation circuit 121, four shift circuits 112a, 112b, 122a, and 122b, and two output buffer circuits 113 and 123 having different drive capabilities. In the reference potential generation circuit 121, two resistors R21 and R22 are connected to both the ends of the series circuit composed of the three resistors R11, R12, and R13. The resistors R11 to R13 are included in the reference potential generation circuit 111 in FIG. 2. Thus, the reference potential generation circuit 121 generates four reference potentials. The four reference potentials are shifted by the shift circuits 112a, 112b, 122a, and 122b, respectively. The shifted voltages are applied to the two output buffer circuits 113 and 123, respectively. The two output buffer circuits 113 and 123 generate different output voltages.

Document 1 also explains that the drive capability of the output buffer circuit component can be changed in three levels or more, namely, in multi-levels corresponding to the output voltages. This multi-level output voltages are realized by generating three or more reference potentials and arranging a plurality of shift circuits and output buffer circuits so as to correspond to those reference potentials.

The above-mentioned voltage generation circuits have the following disadvantages.

In the voltage generation circuits, the dead band is set using two or more reference voltages (potentials). A plurality of dead bands can also be set. However, since the circuitry of each voltage generation circuit itself is fixed, the width of each dead band cannot be changed at will in chip operation. To freely change the width of each dead band in accordance with the chip operation, therefore, the reference potentials have to be changed. Accordingly, the value of the power supply voltage $V_{CC}$ has to be changed. If the power supply voltage $V_{CC}$ is not changed, the resistances of the respective resistors for generating a plurality of reference potentials have to be changed. However, since the arranged resistors are not variable resistors, their resistances cannot be changed depending on the chip operation. Consequently, the width of each dead band cannot be freely controlled during the chip operation.

Further, the voltage generation circuit in FIG. 3 has such a structure that the two resistors, two shift circuits, and one output buffer circuit are added to the components of the voltage generation circuit in FIG. 2. That is, this voltage generation circuit has many components. Disadvantageously, the layout area thereof increases.

SUMMARY OF THE INVENTION

Accordingly, it is an object of the present invention to provide a plate voltage generation circuit capable of arbitrarily controlling a plurality of dead bands during chip operation on the basis of one reference potential in addition to the characteristics of known plate voltage generation circuits.

Another object of the present invention is to provide a plate voltage generation circuit with a small layout area.

The present invention provides a plate voltage generation circuit including: a differential section including at least one differential pair to which a reference voltage and an output voltage are supplied, respectively; a push-pull output section, connected to the differential section, for generating the output voltage; and a dead-band control section, connected to the differential section, for changing the width of a dead band of the output voltage in accordance with a high level or a low level of at least one dead-band control signal externally supplied.

Preferably, in the plate voltage generation circuit, the differential section includes a first differential circuit and a second differential circuit. The first differential circuit includes: a first differential pair composed of a first MOS transistor receiving the reference voltage and a second MOS transistor receiving the output voltage; a first current mirror circuit connected between the first differential pair and a high potential side; and a first constant current source connected between the first differential pair and a low potential side. The second differential circuit includes: a second differential pair composed of a third MOS transistor receiving the reference voltage and a fourth MOS transistor receiving the output voltage; a second constant current source connected between the second differential pair and the high potential side; and a second current mirror circuit connected between the second differential pair and the low potential side.

Preferably, in the plate voltage generation circuit, the push-pull output section includes first and second output MOS transistors, connected in series between the high and low potential sides. In the push-pull output unit, the first output MOS transistor is connected to an output of the first differential circuit and the second output MOS transistor is connected to an output of the second differential circuit. In the push-pull output unit, the output voltage is generated from the node between the first and second output MOS transistors.

Preferably, in the plate voltage generation circuit, the dead-band control section includes an MOS transistor for switching and an MOS transistor for changing a constant ratio and is connected to at least one of the first and second differential circuits. The switching MOS transistor receives the dead-band control signal. The constant-ratio changing MOS transistor receives the reference voltage. The switching MOS transistor and the constant-ratio changing MOS transistor are connected in series.

Particularly, in the differential circuit connected to the dead-band control section, a first ratio is defined between the constants of the two transistors serving as the differential pair in the differential circuit, a second ratio is defined between the constant of one of the two transistors serving as the differential pairs and the sum of the constant of the other transistor and that of the constant-ratio changing MOS transistor. The first and second constant ratios are set so as to differ from each other.

Preferably, in the plate voltage generation circuit, the dead-band control section includes a first dead-band control circuit connected to the first differential circuit and a second dead-band control circuit connected to the second differential circuit. The first dead-band control circuit includes a fifth MOS transistor for switching and a sixth MOS transistor connected in series to the fifth MOS transistor. The fifth MOS transistor receives a first dead-band control signal. The sixth MOS transistor receives the reference voltage. A series circuit composed of the fifth and sixth MOS transistors is connected in parallel to the second MOS transistor. On the other hand, the second dead-band control circuit includes a seventh MOS transistor for switching and an eighth MOS transistor connected in series to the seventh MOS transistor. The seventh MOS transistor receives a second dead-band control signal. The eighth MOS transistor receives the reference voltage. A series circuit composed of the seventh and eighth MOS transistors is connected in parallel to the fourth MOS transistor.

DESCRIPTION OF THE PREFERRED EMBODIMENTS

Figure 1:
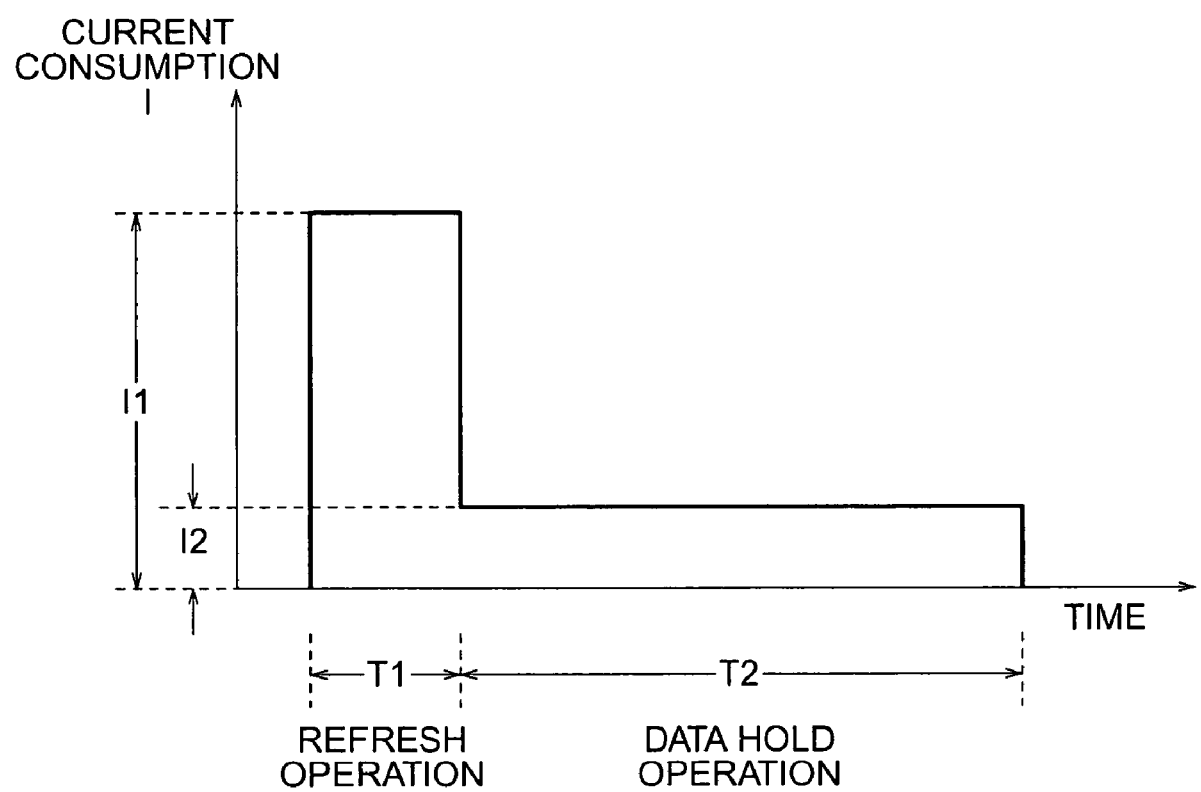
FIG. 1 is a waveform chart explaining an example of a refresh current in a DRAM.
Figure 2:
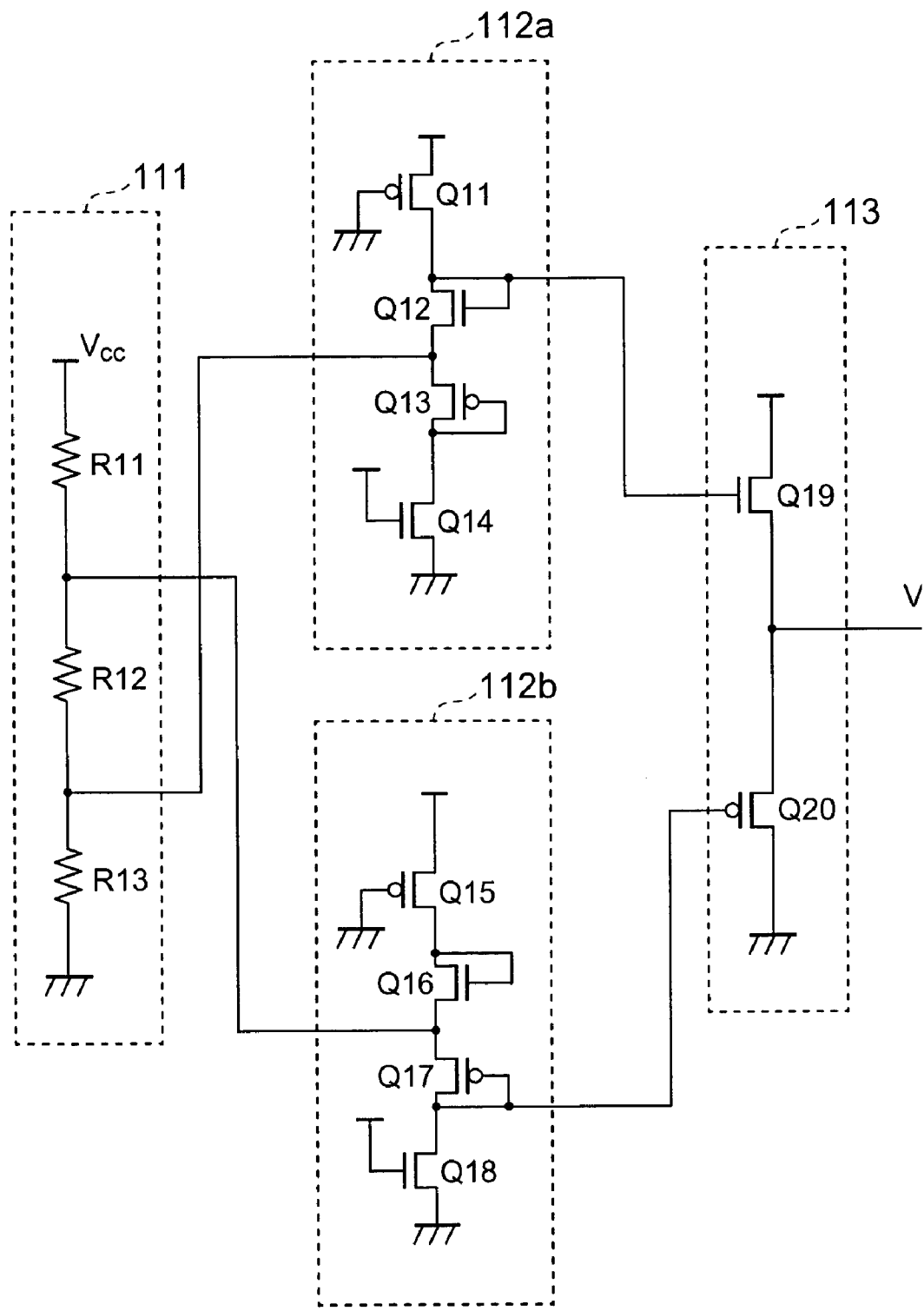
FIG. 2 is a diagram explaining a first example of a known plate voltage generation circuit.
Figure 3:
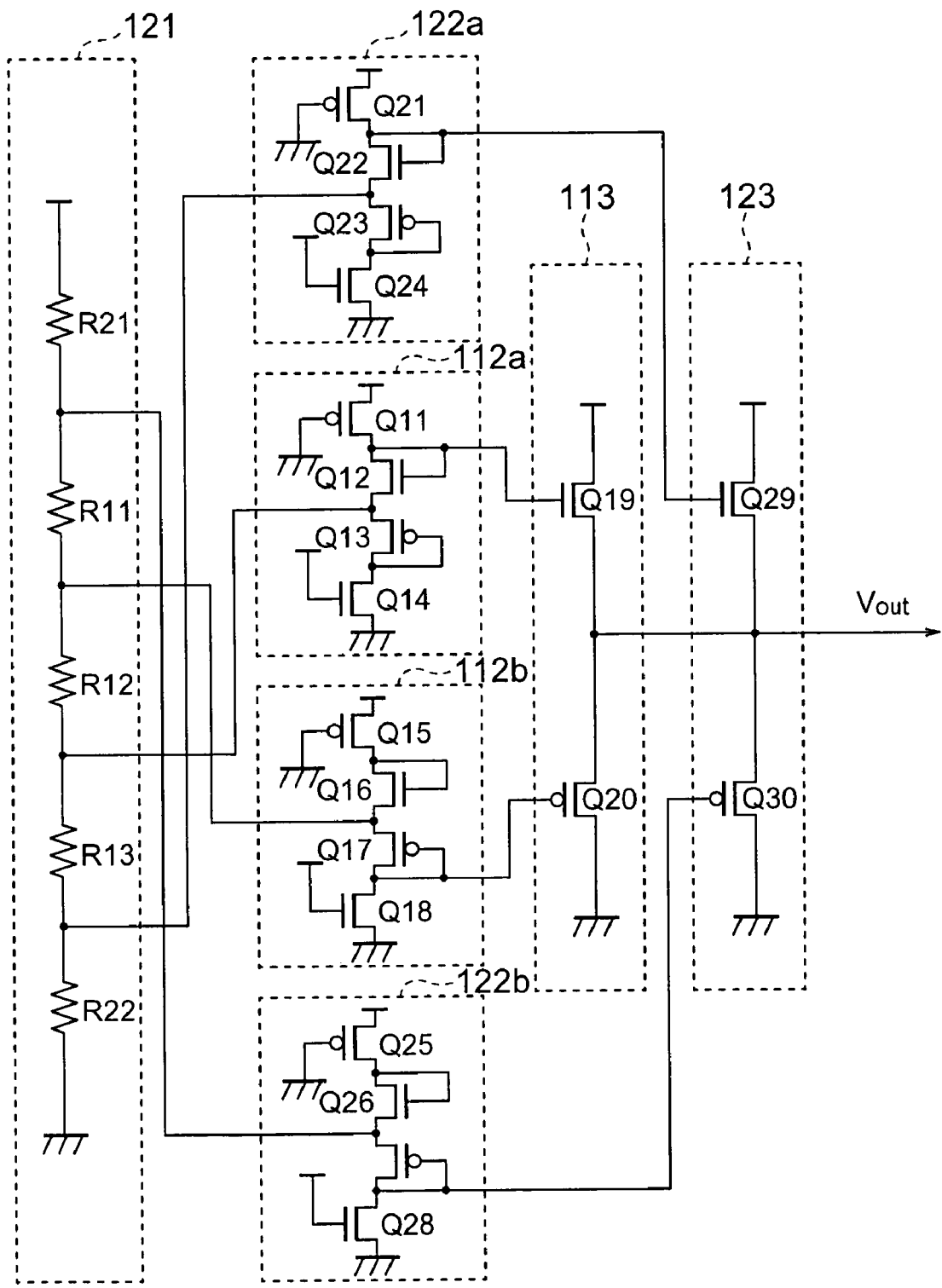
FIG. 3 is a diagram explaining a second example of a known plate voltage generation circuit.
Figure 4:
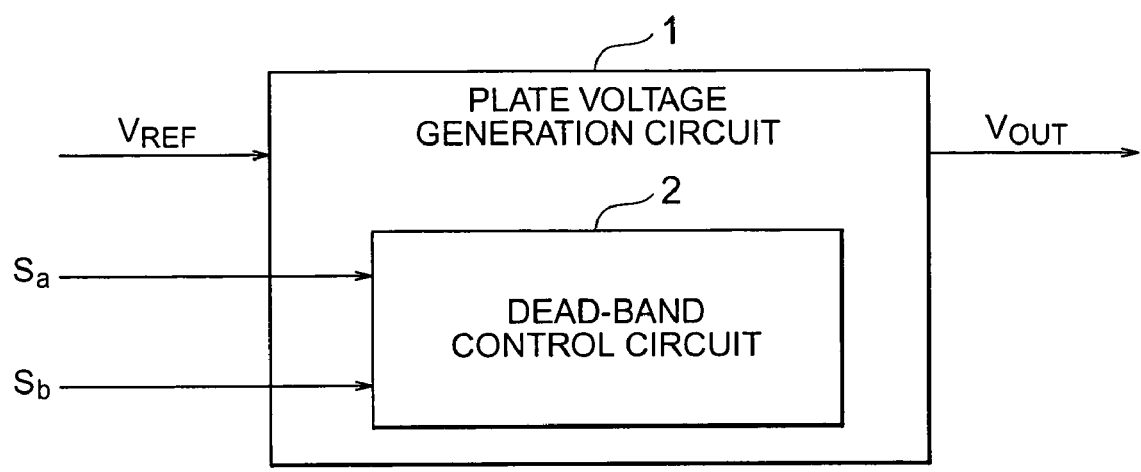
FIG. 4 is a block diagram of the outline of a plate voltage generation circuit according to the present invention.

The outline of the present invention will be described with reference to FIG. 4. Referring to FIG. 4, a plate voltage generation circuit 1 receives a voltage, that is half an external power supply voltage $V_{DD}$, as a reference voltage $V_{REF}$ and then generates a voltage around the reference voltage $V_{REF}$ as an output voltage $V_{OUT}$. The plate voltage generation circuit 1 has a dead-band control circuit 2. The dead-band control circuit 2 receives first and second dead-band control signals Sa and Sb, which are used to externally control the width of a dead band. On the basis of the received dead-band control signals Sa and Sb, the dead-band control circuit 2 controls the width of the dead band in the output voltage $V_{OUT}$. The dead-band control circuit 2 can be included in the plate voltage generation circuit or can be externally attached thereto.

According to the dead-band control signals Sa and Sb, the operation of the dead-band control circuit 2 is controlled, namely, the dead-band control circuit 2 is started or stopped during each chip operation such as refresh, read, write, or data hold. On the basis of the dead-band control signals Sa and Sb, the dead-band control circuit 2 sets the width of the dead band of a drive circuit in the plate voltage generation circuit 1 to an arbitrary value and further controls the band width.

The width of the dead band is controlled, so that one plate voltage generation circuit can have a plurality of response speeds and the amount of a through current can be controlled. In addition, the through current can be suppressed on the basis of one reference voltage with the minimum circuitry.

A plate voltage generation circuit according to a first embodiment of the present invention will now be described with reference to FIG. 5. The plate voltage generation circuit includes an N-MOSFET type differential circuit 11a (first differential circuit), a P-MOSFET type differential circuit 11b (second differential circuit), a first dead-band control circuit 12a, a second dead-band control circuit 12b, and a push-pull output circuit 3.

The differential circuit 11a includes p-channel metal oxide semiconductor field-effect transistors (p-MOSFETs) (hereinbelow, simply referred to as pMOS transistors or MOS transistors) M3 and M4, n-channel metal oxide semiconductor field-effect transistors (n-MOSFETs) (hereinbelow, simply referred to as nMOS transistors or MOS transistors) M5 and M6, and a first constant current source S11. The pMOS transistors M3 and M4 constitute a current mirror circuit. The pMOS transistor M4 serves as the input side of the current mirror circuit. The nMOS transistors M5 and M6 (first and second MOS transistors) constitute a first differential pair. The reference voltage $V_{REF}$ is applied to the gate of the nMOS transistor M5 and the output voltage $V_{OUT}$ is applied to the gate of the nMOS transistor M6, so that the first differential pair compares the reference voltage $V_{REF}$ with the output voltage $V_{OUT}$.

The differential circuit 11a has the following configuration. The respective sources of the pMOS transistors M3 and M4 are connected to the external power supply voltage $V_{DD}$ which is high potential. The gate of the pMOS transistor M3 is connected to the gate of the pMOS transistor M4, the drain thereof, and the drain of the nMOS transistor M6. The drain of the pMOS transistor M3 is connected to the drain of the nMOS transistor M5. The respective sources of the nMOS transistors M5 and M6 are connected to ground, which is low potential, through the first constant current source S11.

The differential circuit 11b includes pMOS transistors M7 and M8 (third and fourth MOS transistors), nMOS transistors M9 and M10, and a second constant current source S12. The pMOS transistors M7 and M8 constitute a second differential pair. The reference voltage $V_{REF}$ is applied to the gate of the pMOS transistor M7, and the output voltage $V_{OUT}$ is applied to the gate of the pMOS transistor M8, so that the second differential pair compares the reference voltage $V_{REF}$ with the output voltage $V_{OUT}$. The nMOS transistors M9 and M10 constitute a current mirror circuit. The nMOS transistor M10 serves as the input side of the current mirror circuit.

The differential circuit 11b has the following connections. The respective drains of the pMOS transistors M7 and M8 are connected to the external power supply voltage $V_{DD}$ at high potential through the second constant current source S12. The source of the pMOS transistor M7 is connected to the source of the nMOS transistor M9. The source of the pMOS transistor M8 is connected to the respective gates of the nMOS transistors M9 and M10 and the source of the nMOS transistor M10. The respective drains of the nMOS transistors M9 and M10 are connected to the ground at low potential.

The dead-band control circuit 12a includes a series circuit composed of a pMOS transistor M11 (fifth MOS transistor) and an nMOS transistor M12 (sixth MOS transistor). The drain of the pMOS transistor M11 is connected to the source of the nMOS transistor M12, so that the dead-band control circuit 12a is connected in parallel to the nMOS transistor M6 of the differential circuit 11a. The pMOS transistor M11 operates as a switching transistor. When the dead-band control signal Sa is externally supplied to the gate of the pMOS transistor M11, the dead-band control circuit 12a arbitrarily changes the ratio of the constants of the nMOS transistors M5 and M6 serving as the differential pair in the differential circuit 11a during the chip operation. The nMOS transistor M12 can be called an MOS transistor for changing the constant ratio.

To realize the above-mentioned operation, the dead-band control signal Sa is supplied to the gate of the pMOS transistor M11 and the source of the pMOS transistor M11 is connected to the node between the drain of the pMOS transistor M4 and that of the nMOS transistor M6 in the differential circuit 11a. The reference voltage $V_{REF}$ is applied to the gate of the nMOS transistor M12. The drain of the nMOS transistor M12 and the respective sources of the nMOS transistors M5 and M6 are connected to the ground through the constant current source S11.

The dead-band control circuit 12b includes a series circuit composed of a pMOS transistor M13 (eighth MOS transistor) and an nMOS transistor M14 (seventh MOS transistor). The source of the pMOS transistor M13 is connected to the drain of the nMOS transistor M14. Thus, the dead-band control circuit 12b is connected in parallel to the PMOS transistor M8 of the differential circuit 11b. The nMOS transistor M14 functions as a switching transistor. When the dead-band control signal Sb is externally supplied to the gate of the nMOS transistor M14, the dead-band control circuit 12b arbitrarily changes the ratio of the constants of the pMOS transistors M7 and M8 serving as the differential pair in the differential circuit 11b during the chip operation. The nMOS transistor M13 can be called an MOS transistor for changing the constant ratio.

To realize the above-mentioned operation, the drain of the pMOS transistor M13 and the respective drains of the pMOS transistors M7 and M8 are connected to the external power supply voltage $V_{DD}$ at high potential through the constant current source S12. The reference voltage $V_{REF}$ is supplied to the gate of the pMOS transistor M13. The dead-band control signal Sb is supplied to the gate of the nMOS transistor M14. The source of the nMOS transistor M14 is connected to the node between the source of the pMOS transistor M8 and that of the nMOS transistor M10 in the differential circuit 11b.

The push-pull output circuit 3 includes a series circuit composed of a pMOS transistor M1 (first output MOS transistor) and an nMOS transistor M2 (second output MOS transistor). The drain of the pMOS transistor M1 is connected to the source of the nMOS transistor M2. The source of the pMOS transistor M1 is connected to the external power supply voltage $V_{DD}$ at high potential. The drain of the nMOS transistor M2 is connected to the ground at low potential.

The gate of the pMOS transistor M1 is connected to the respective drains of the pMOS and nMOS transistors M3 and M5. Thus, an output of the differential circuit 11a is supplied to the gate of the pMOS transistor M1. The gate of the nMOS transistor M2 is connected to the respective sources of the pMOS and nMOS transistors M7 and M9. Consequently, an output of the differential circuit 11b is supplied to the gate of the nMOS transistor M2. The output voltage $V_{OUT}$ is generated from the node between the drain of the pMOS transistor M1 and the source of the nMOS transistor M2.

Figure 6:
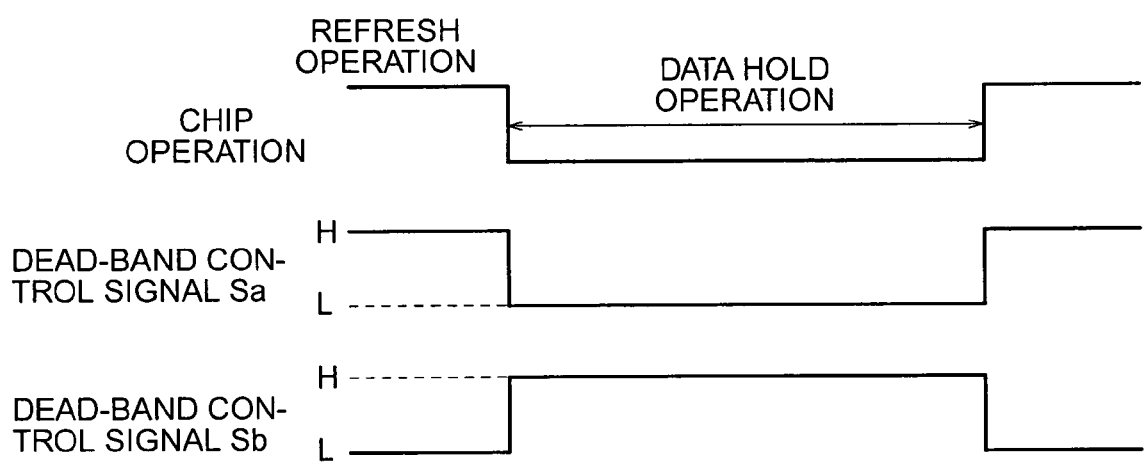
FIG. 6 is a time chart explaining an example of operating characteristic related to dead-band control signals in the plate voltage generation circuit in FIG. 5.
Figure 7:
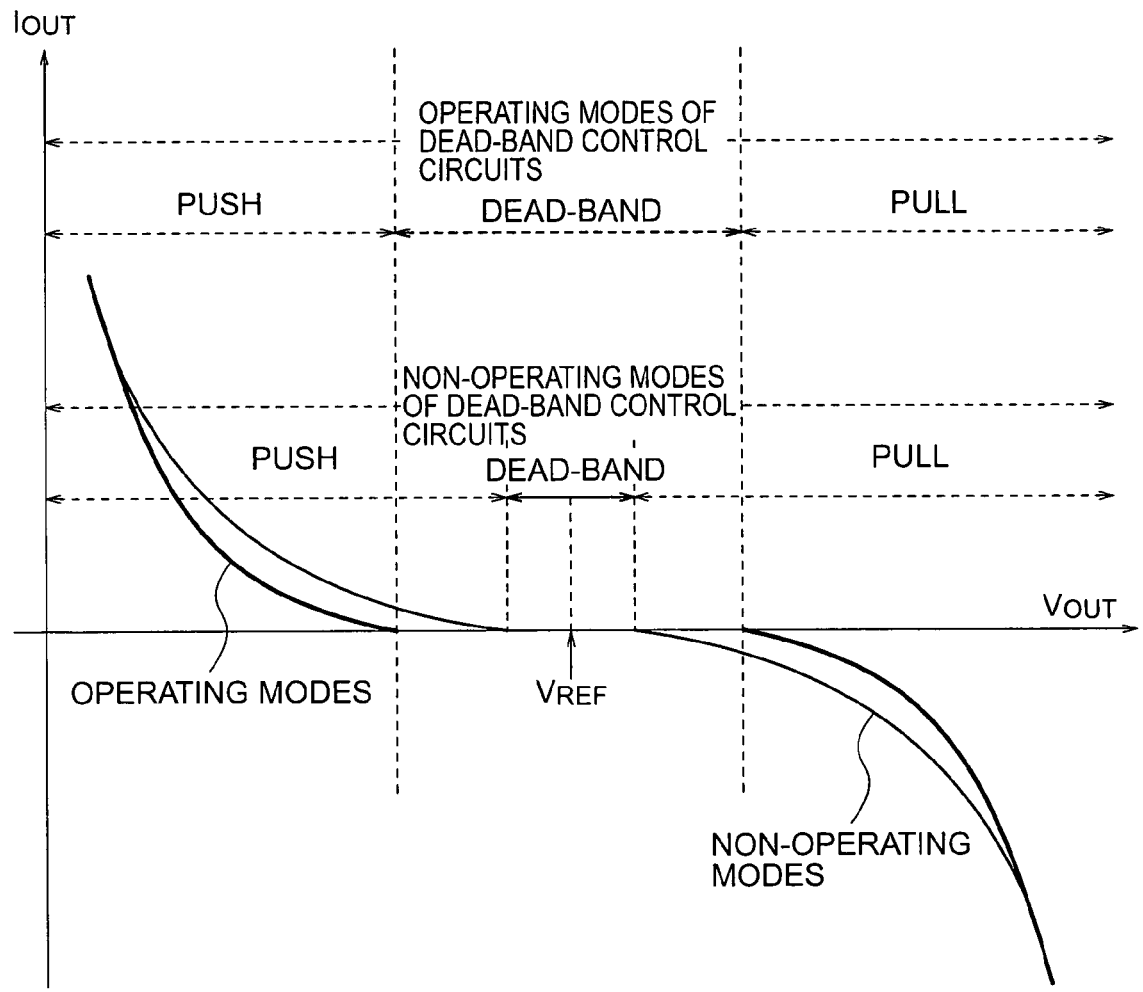
FIG. 7 is a waveform chart explaining an example of the operating characteristic related to the widths of dead bands in the plate voltage generation circuit in FIG. 5.

The operation of the plate voltage generation circuit according to the first embodiment will now be described with reference to FIGS. 5 to 7. FIG. 6 is a time chart showing the relation between refresh operation time, data hold operation time, and the dead-band control signals Sa and Sb. FIG. 7 shows the operation characteristic of the plate voltage generation circuit. In the following description, pMOS and nMOS transistors will be simply referred to as transistors.

In the refresh operation in which chip current consumption is high, the dead-band control signal Sa becomes a level "H" (high) and the dead-band control signal Sb becomes a level "L" (low) as shown by solid lines in FIG. 6. In this state, the transistors M11 and M14 are turned off, so that the respective operations of the dead-band control circuits 12a and 12b are stopped. In the differential circuit 11a, the transistors M3 to M6 operate (turn on). In the differential circuit 11b, the transistors M7 to M10 operate (turn on). In this case, the ratio of the sum of the constants of the right transistors to that of the left transistors in the differential circuit 11a is the same as that between the constants of the transistors M5 and M6. The ratio of the sum of the constants of the right transistors to that of the left transistors in the differential circuit 11b is the same as that of the constants of the transistors M7 and M8. Each difference between the constants is small.

The dead band provided by the differential circuits 11a and 11b corresponds to a dead band in the non-operating modes of the dead-band control circuits shown in the characteristic diagram of FIG. 7. The dead band is set to the same range as that of the conventional dead band. Since the dead band is set to the same range as that of the conventional one, the voltage level, at which the gates of the transistors M1 and M2 are turned on in the push-pull output circuit 3 for pushing and pulling current, can be approximated to the reference voltage $V_{REF}$. The above voltage level will be referred to as a turn-on voltage level of the output MOS transistor.

On the other hand, in the data hold operation, the dead-band control signal Sa becomes the level "L" and the dead-band control signal Sb goes to the level "H". Thus, the operation of the dead-band control circuits 12a and 12b are started. The start of the dead-band control circuits 12a and 12b leads to the differential operations of the transistors M3 to M6 and the transistors M7 to M10 in the differential circuits 11a and 11b. The transistors M11 and M12 in the dead-band control circuit 12a and the transistors M13 and M14 in the dead-band control circuit 12b additionally operate simultaneously with the above differential operations. Consequently, the transistors M5, M12, M7 and M13 receive the reference voltage $V_{REF}$.

On the other hand, the transistors M6 and M8 receive the output voltage $V_{OUT}$. Thus, the constant ratio in the differential circuit 11a corresponds to the ratio of the sum of the constants of the transistors M5 and M12 to the constant of the transistor M6. Similarly, the constant ratio in the differential circuit 11b corresponds to the ratio of the sum of the constants of the transistors M7 and M13 to the constant of the transistor M8. Consequently, each difference between the constants increases. Increasing the constant ratios results in a wider dead band in the operating modes of the dead-band control circuits than that in the non-operating modes thereof as shown in FIG. 7.

The dead band in the operating modes of the dead-band control circuits is set wider than that in the non-operating modes. Consequently, a difference between the turn-on voltage level and the reference voltage $V_{REF}$ is larger than that therebetween in the non-operating modes of the dead-band control circuits 12a and 12b.

As mentioned above, the two dead-band control signals Sa and Sb are externally supplied to the two differential circuits 11a and 11b in the plate voltage generation circuit, respectively. Thus, the dead-band control circuits 12a and 12b can be arbitrarily switched between the operating mode and the non-operating mode in accordance with the chip operation. Therefore, the width of the dead band can be arbitrarily controlled in accordance with the chip operation.

A plate voltage generation circuit according to a second embodiment of the present invention will now be described with reference to FIGS. 8 to 10. Although the fundamental configuration of the plate voltage generation circuit according to the second embodiment is the same as that shown in FIG. 5, the configurations of dead-band control circuits and connections therein are improved. To simplify explanation, the same components as those in FIG. 5 are designated by the same reference numerals and symbols and the description of the same components and connections are omitted.

Figure 5:
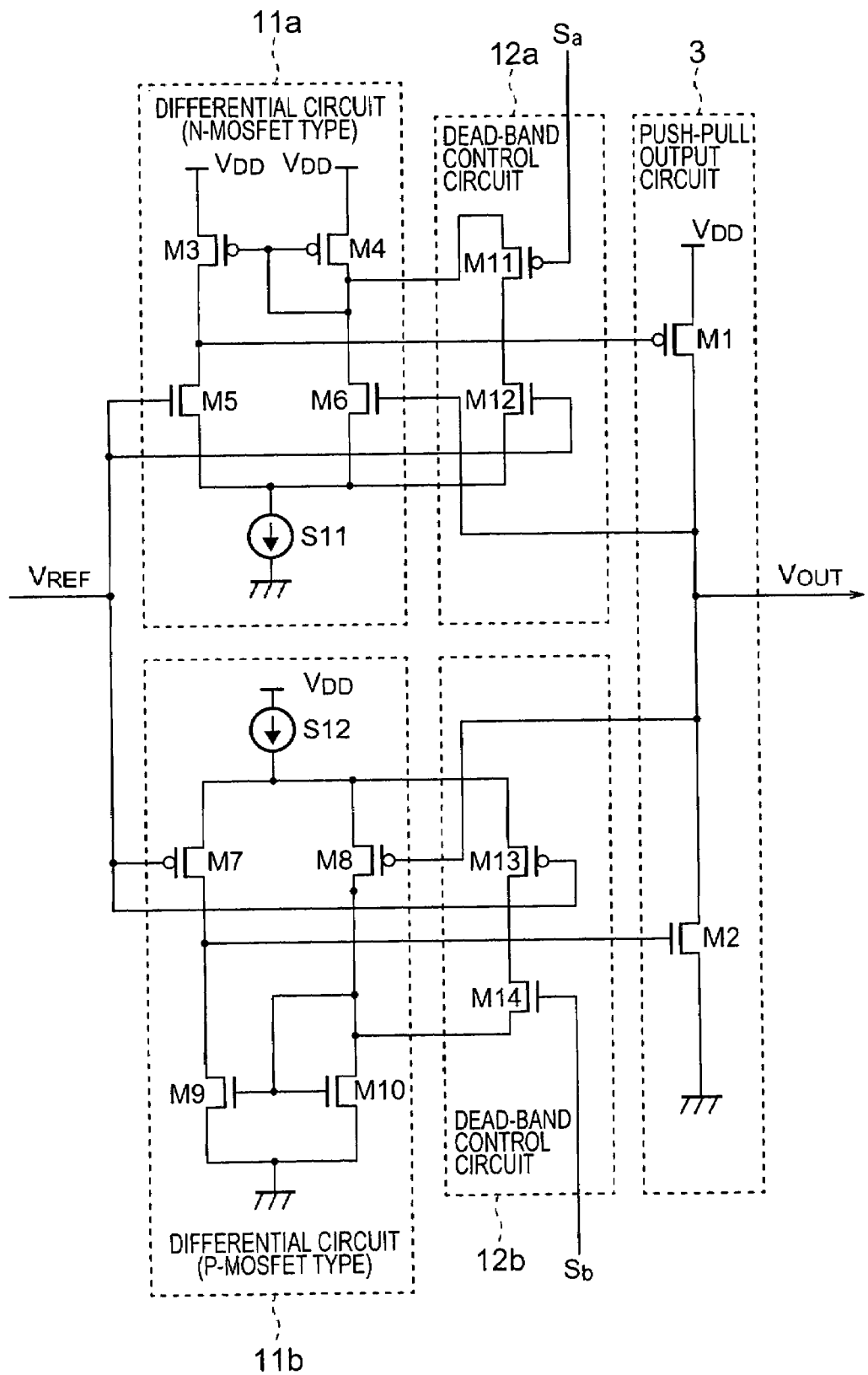
FIG. 5 is a diagram of the configuration of a plate voltage generation circuit according to a first embodiment of the present invention.

The present plate voltage generation circuit differs from that in FIG. 5 in that an N-MOSFET type differential circuit 21a is provided instead of the N-MOSFET type differential circuit 11a and a third dead-band control circuit 22a is connected to the input side of the differential circuit 21a. The dead-band control circuit 12b in the first embodiment is eliminated. Thus, the present plate voltage generation circuit has a simpler configuration.

As mentioned above, the internal structure of the differential circuit 21a and the internal structures of the differential circuit 11b and the push-pull output circuit 3 and the connection therebetween are not changed. The circuitry of the dead-band control circuit 22a is the same as that of the dead-band control circuit 12a according to the first embodiment.

The differential circuit 21a is constructed in a manner similar to the differential circuit 11a according to the first embodiment. In other words, the differential circuit 21a includes pMOS transistors M23 and M24, nMOS transistors M25 and M26, and a constant current source S21. The pMOS transistors M23 and M24 constitute a current mirror circuit. The pMOS transistor M24 serves as the input side of the current mirror circuit. The nMOS transistors M25 and M26 constitute a differential pair. The reference voltage $V_{REF}$ is applied to the nMOS transistor M25 and the output voltage $V_{OUT}$ is applied to the nMOS transistor M26. Thus, the differential pair compares the reference voltage $V_{REF}$ with the output voltage $V_{OUT}$.

The dead-band control circuit 22a includes a series circuit composed of a pMOS transistor M31 (ninth MOS transistor) and an nMOS transistor M32 (tenth MOS transistor). The drain of the pMOS transistor M31 is connected to the source of the nMOS transistor M32. Consequently, the dead-band control circuit 22a is connected in parallel to the nMOS transistor M25 in the differential circuit 21a. The pMOS transistor M31 serves as a switching transistor. When the dead-band control signal Sa is externally supplied to the gate of the pMOS transistor M31, the dead-band control circuit 21a arbitrarily changes the ratio of the constants of the nMOS transistors M25 and M26 serving as the differential pair in the differential circuit 21a during the chip operation. The nMOS transistor M32 can be called an MOS transistor for changing the constant ratio.

To realize the above-mentioned operation, the dead-band control signal Sa is supplied to the gate of the pMOS transistor M31 and the source of the pMOS transistor M31 is connected to the node between the drains of the pMOS and nMOS transistors M23 and M25 in the differential circuit 21a. The reference voltage $V_{REF}$ is applied to the gate of the nMOS transistor M32. The drain of the nMOS transistor M32 and the respective sources of the nMOS transistors M25 and M26 are connected to the ground through the constant current source S21.

According to the present embodiment, when the dead-band control circuit 22a is operated and the combination of the transistors M32 and M25 and the transistor M26 serve as a differential pair, the ratio of the sum of the constants of the right transistors to that of the left transistors in the differential circuit 21a is set to a small value so as to reduce the width of the dead band. In other words, when the dead-band control circuit 22a is not operated and the transistors M25 and M26 serve as a differential pair, the constant of the transistor M25 on the input side is smaller than that of the transistor M26, thus increasing the width of the dead band.

Figure 9:
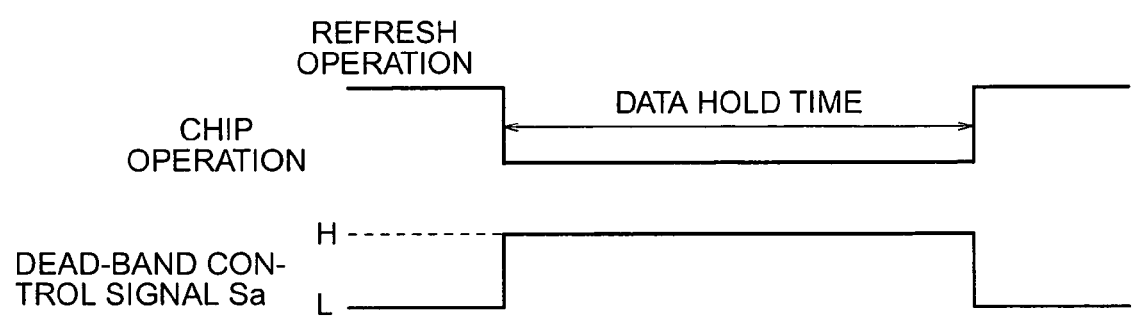
FIG. 9 is a time chart explaining an example of operating characteristic related to dead-band control signals in the plate voltage generation circuit in FIG. 8.

Referring to FIG. 9, therefore, when current consumption is large, for example, in the refresh operation, the dead-band control signal Sa causes the turn-on of the dead-band control circuit 22a. On the other hand, when current consumption is small, for example, in the data hold operation, the dead-band control signal Sa causes the turn-off of the dead-band control circuit 22a.

Figure 8:
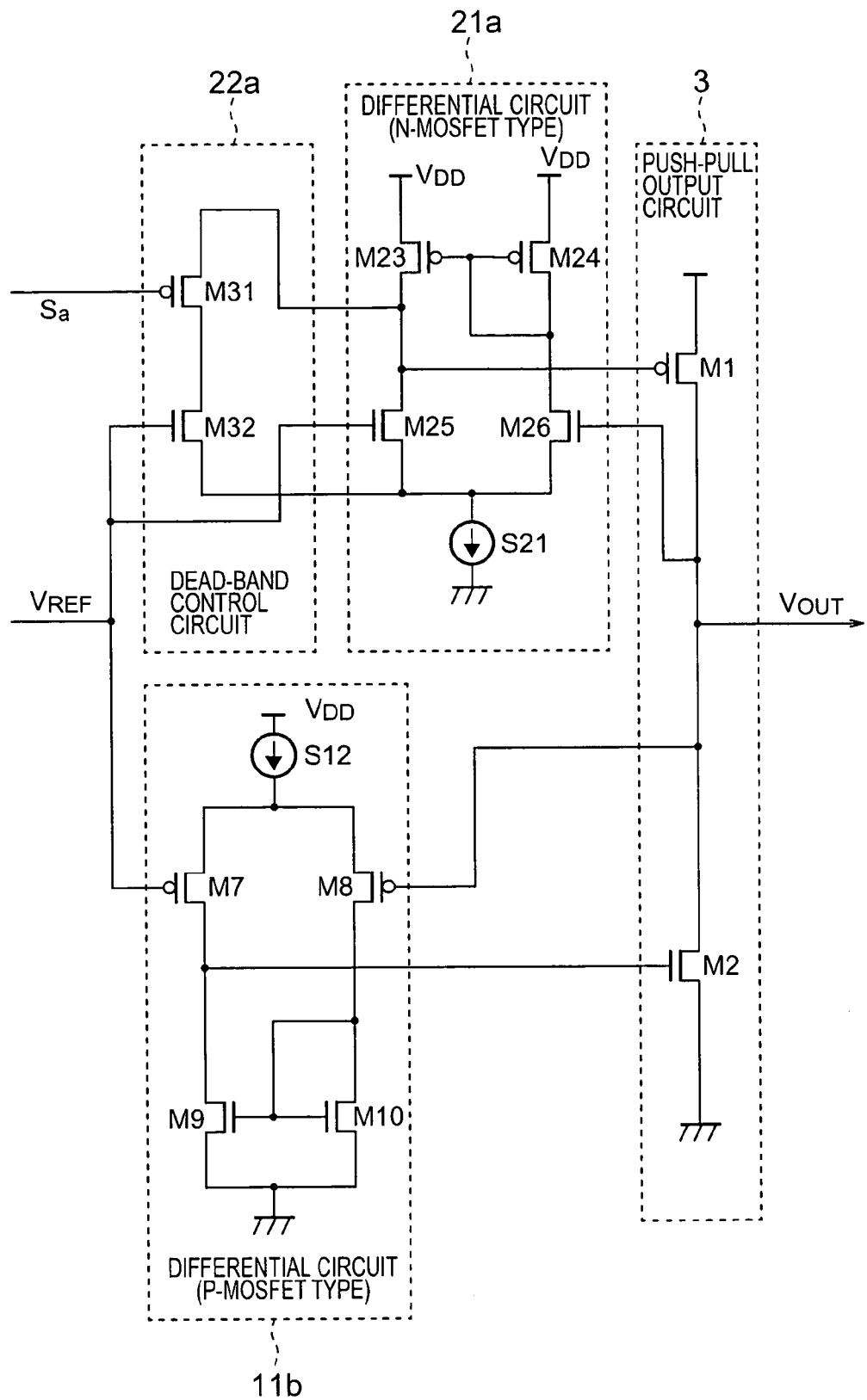
FIG. 8 is a diagram of the configuration of a plate voltage generation circuit according to a second embodiment of the present invention.

In the circuitry in FIG. 8, the dead-band control circuit 22a is turned on to reduce the width of the dead band. The dead-band control circuit 22a is turned off to increase the width thereof. This control is opposite to the control for the dead-band control circuit 12a in FIG. 5 according to the first embodiment. However, the present plate voltage generation circuit has the same advantages as those according to the first embodiment. Since the dead-band control circuit 22a is combined only with the differential circuit 21a, the circuitry of FIG. 8 has operating characteristic shown in FIG. 10. In other words, the push operation alone is controlled by the dead-band control circuit 22a. The pull operation is independent of the operation of the dead-band control circuit 22a. Consequently, the output voltage $V_{OUT}$ changed to the dead band becomes constant. Accordingly, in the operating mode of the dead-band control circuit 22a, the dead band in FIG. 10 is narrower than that in FIG. 7 by an amount adjacent to the pull operation in FIG. 7. Therefore, the output voltage $V_{OUT}$ at this time is lower than that in the non-operating mode of the dead-band control circuit 12a shown in FIG. 5.

A third embodiment realizes the operation opposite to that according to the second embodiment. The third embodiment will now be described with reference to FIGS. 11 and 12. In a plate voltage generation circuit according to the third embodiment, in the operating mode of a dead-band control circuit, the output voltage $V_{OUT}$ can be set higher than that in the non-operating modes of the dead-band control circuits 12a and 12b according to the second embodiment.

The present plate voltage generation circuit differs from that in FIG. 5 according to the first embodiment in that a P-MOSFET type differential circuit 21b is provided instead of the P-MOSFET type differential circuit 11b and a fourth dead-band control circuit 22b is connected to the input side of the differential circuit 21b. The dead-band control circuit 12a according to the first embodiment is eliminated.

The internal structure of the differential circuit 21b, and the internal structures of the differential circuit 11a and the push-pull output circuit 3 and the connection therebetween are not changed. The circuitry of the dead-band control circuit 22b is the same as that of the dead-band control circuit 12b according to the first embodiment.

The differential circuit 21b is constructed in a manner similar to the differential circuit 11b according to the first embodiment. In other words, the differential circuit 21b includes PMOS transistors M27 and M28, nMOS transistors M29 and M30, and a constant current source S22. The pMOS transistors M27 and M28 constitute a differential pair. The reference voltage $V_{REF}$ is applied to the gate of the pMOS transistor M27 and the output voltage $V_{OUT}$ is applied to the gate of the pMOS transistor M28, so that the differential pair compares the reference voltage $V_{REF}$ with the output voltage $V_{OUT}$. The nMOS transistors M29 and M30 constitute a current mirror circuit. The nMOS transistor M30 serves as the input side of the current mirror circuit.

The dead-band control circuit 22b includes a series circuit composed of a pMOS transistor M33 (twelfth MOS transistor) and an nMOS transistor M34 (eleventh MOS transistor). The source of the pMOS transistor M33 is connected to the drain of the nMOS transistor M34, so that the dead-band control circuit 22b is connected in parallel to the pMOS transistor M27 in the differential circuit 21b. The nMOS transistor M34 serves as a switching transistor. When the dead-band control signal Sb is externally supplied to the gate of the nMOS transistor M34, the dead-band control circuit 22b arbitrarily changes the ratio between the constants of the pMOS transistors M27 and M28 serving as the differential pair in the differential circuit 21b during the chip operation. The pMOS transistor M33 can be called a MOS transistor for changing the constant ratio.

To realize the above-mentioned operation, the drain of the pMOS transistor M33 and the respective drains of the pMOS transistors in the differential circuit 21b are connected to the external power supply voltage $V_{DD}$ through the constant current source S22. The reference voltage $V_{REF}$ is applied to the gate of the pMOS transistor M33. The dead-band control signal Sb is supplied to the gate of the nMOS transistor M34. The source of the nMOS transistor M34 is connected to the node between the respective sources of the pMOS and nMOS transistors M27 and M29.

The dead-band control circuit 12a shown in FIG. 5 is eliminated. The connection between the differential circuit 21b and the dead-band control circuit 22b is as follows. The source of the transistor M34 is connected to the respective sources of the transistors M27 and M29 in the differential circuit 21b.

For the ratio of the sum of the constants of the right transistors to that of the left transistors in the differential circuit 21b, when the dead-band control circuit 22b is operated and the combination of the transistors M33 and M27 and the transistor M28 serve as a differential pair, the ratio of the sum of the constants of the right transistors to that of the left transistors in the differential circuit 21b is set to a small value so as to reduce the width of the dead band. In other words, when the dead-band control circuit 22b is not operated and the transistors M27 and M28 serve as a differential pair, the constant of the transistor M27 on the input side is smaller than that of the transistor M28, thus increasing the width of the dead band. Therefore, when current consumption is large, for example, in the refresh operation, the dead-band control signal Sb causes the turn-on of the dead-band control circuit 22b. On the other hand, when the current consumption is small, for example, in the data hold operation, the dead-band control signal Sb causes the turn-off of the dead-band control circuit 22b.

According to the third embodiment, the dead-band control circuit 22b is turned on to reduce the width of the dead band. The dead-band control circuit 22b is turned off to increase the width thereof. This control is opposite to the control for the dead-band control circuit 12b in FIG. 5 according to the first embodiment. However, the present plate voltage generation circuit has the same advantages as those according to the first embodiment.

Figure 11:
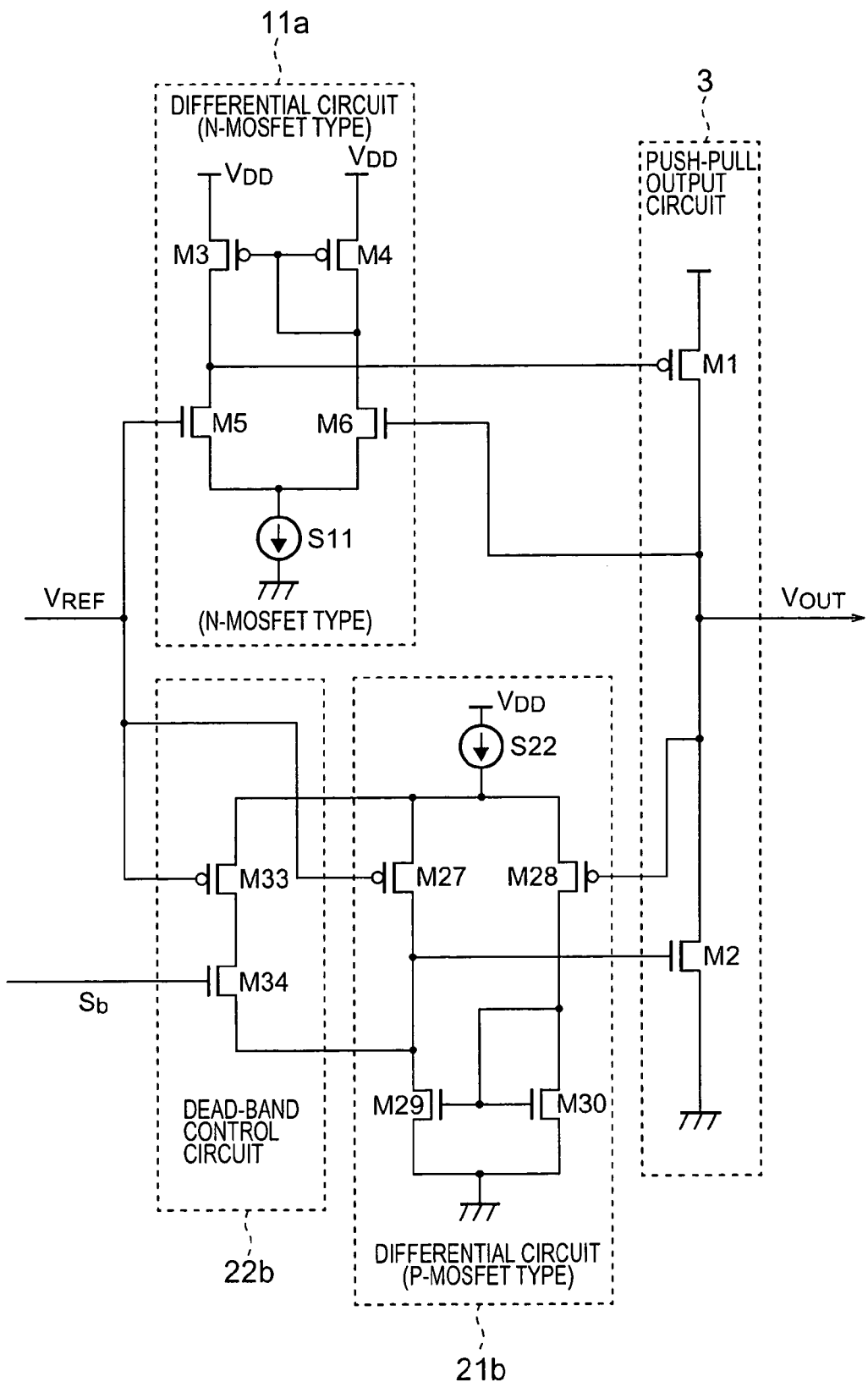
FIG. 11 is a diagram of the configuration of a plate voltage generation circuit according to a third embodiment of the present invention.
Figure 12:
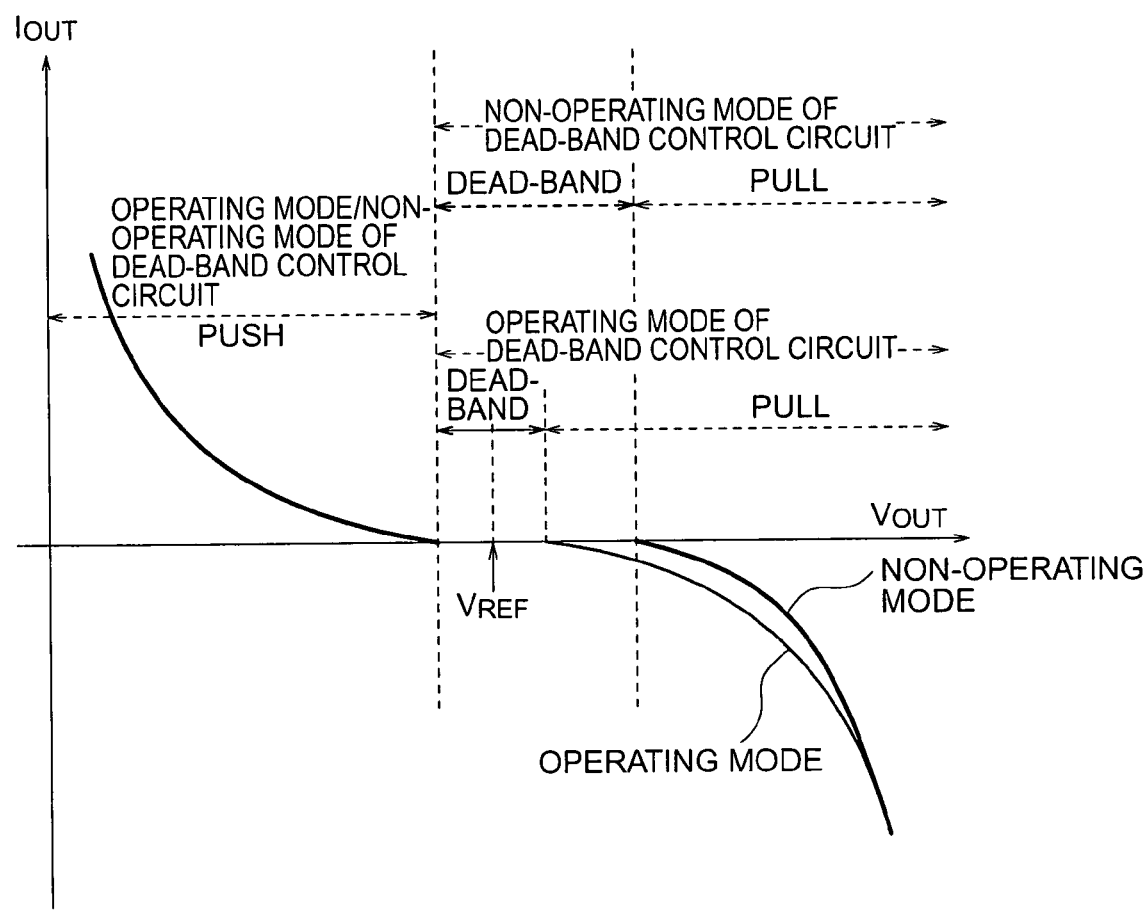
FIG. 12 is a waveform chart explaining an example of operating characteristic of the widths of dead bands in the plate voltage generation circuit in FIG. 11.

Since the dead-band control circuit 22b is combined only with the differential circuit 21b, the circuitry of FIG. 11 has operating characteristic shown in FIG. 12. In other words, referring to FIG. 12, the pull operation alone is controlled by the dead-band control circuit 22b. The push operation is independent of the operation of the dead-band control circuit 22b. Thus, the output voltage $V_{OUT}$ changed to the dead band becomes constant. Consequently, during the operation of the dead-band control circuit 22b, the dead band in FIG. 12 is narrower than that in FIG. 7 by an amount adjacent to the push operation in FIG. 7. Therefore, the output voltage $V_{OUT}$ at this time is higher than that in the non-operating modes of the dead-band control circuits shown in FIG. 5.

Although diagrammatic representation and explanation are omitted, a plate voltage generation circuit can include both the above-mentioned differential circuits 21a and 21b and further include the dead-band control circuits 22a and 22b on the respective input sides of the circuits 21a and 21b. Thus, the circuit can have both the operating characteristics in FIGS. 10 and 12 and provide the same functions as those in FIG. 5 according to the first embodiment.

The dead-band control circuit can be added to either one of the differential circuits 11a and 11b in the plate voltage generation circuit in FIG. 5 according to the first embodiment. Consequently, this plate voltage generation circuit has the same operating characteristic as that in FIG. 10 or 12. The present plate voltage generation circuit can include the same functions as those of the plate voltage generation circuit in FIG. 8 or 11.

In the above description, each of the circuits and devices designated by the reference numerals and symbols may have the above-mentioned function in the corresponding plate voltage generation circuit. The respective components need not have the same constant.

Modifications of the above-mentioned first embodiment will now be described with reference to FIGS. 13 to 15.

In the above-described first embodiment, in the configuration of each dead-band control circuit, the source of the switching MOS transistor which receives the dead-band control signal is connected to the MOSFET type differential circuit. Accordingly, in the OFF state of the dead-band control circuit, the node between the switching MOS transistor and the MOS transistor in which the reference voltage is applied to the gate thereof is floating. Therefore, when the dead-band control circuit is turned on, a potential of the node may be fluctuated.

Figure 13:
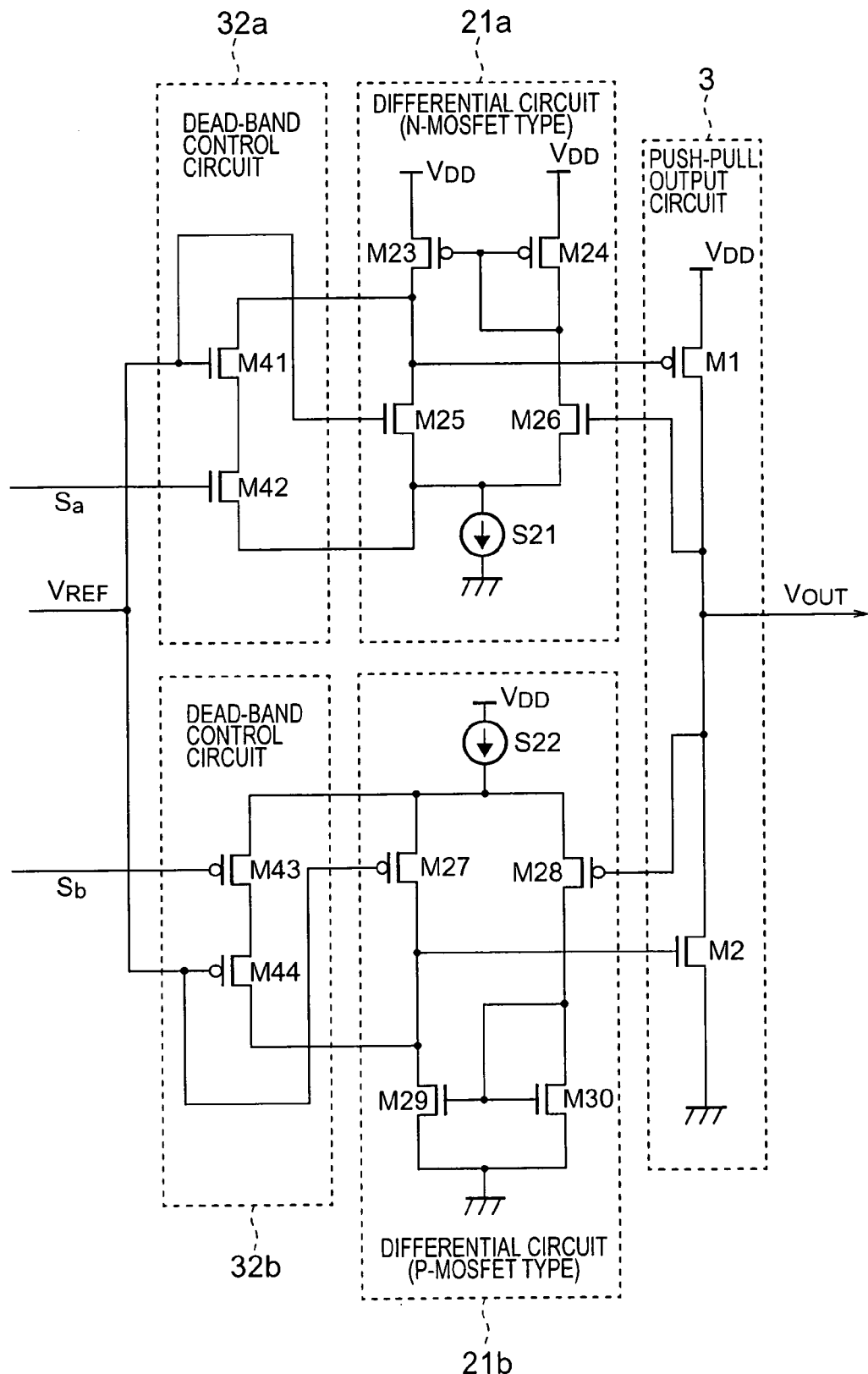
FIG. 13 is a diagram of a first modification of the first embodiment according to the present invention.

FIG. 13 shows a plate voltage generation circuit in which the drains of switching MOS transistors are connected to the differential circuits, respectively, in order to prevent the above-mentioned node from being floating. Components having the same functions as those of the components in FIG. 5 are designated by the same reference numerals and symbols.

FIG. 13 shows the plate voltage generation circuit according to a first modification of the first embodiment shown in FIG. 5. In the present plate voltage generation circuit, the differential circuits 11a and 11b in FIG. 5 are replaced by the differential circuits 21a and 21b. The internal configuration of each of the differential circuits 21a and 21b is not changed. The dead-band control circuits 12a and 12b in FIG. 5 are replaced by fifth and sixth dead-band control circuits 32a and 32b. The dead-band control circuit 32a includes an MOS transistor M42 (thirteenth MOS transistor) in which the dead-band control signal Sa is supplied to the gate. The dead-band control circuit 32b includes an MOS transistor M43 (fifteenth MOS transistor) in which the dead-band control signal Sb is supplied to the gate. The drains of the MOS transistors M42 and M43 are connected to the differential circuits 21a and 21b, respectively. Since the differential circuits 21a and 21b have been mentioned in the foregoing embodiments, the description thereof is omitted.

The dead-band control circuit 32a includes a series circuit composed of an nMOS transistor M41 (fourteenth MOS transistor) and an nMOS transistor M42. The drain of the transistor M41 is connected to the source of the transistor M42. The reference voltage $V_{REF}$ is supplied to the gate of the transistor M41. The source of the transistor M41 is connected to the node between the drains of the transistors M23 and M25. The drain of the transistor M42 and the respective sources of the transistors M25 and M26 are connected to the constant current source S21. The dead-band control signal Sa is supplied to the gate of the transistor M42.

Similar to the above, the dead-band control circuit 32b includes a series circuit composed of pMOS transistors M43 and M44 (sixteenth MOS transistor). The source of the transistor M43 is connected to the drain of the transistor M44. The drain of the transistor M43 and the respective sources of the transistors M27 and M28 are connected to the constant current source S22. The above-mentioned dead-band control signal Sb is supplied to the gate of the transistor M43. The reference voltage $V_{REF}$ is connected to the gate of the transistor M44. The source of the transistor M44 is connected to the node between the drains of the transistors M27 and M29 in the differential circuit 21b. The transistors M41 and M44 can be called MOS transistors for changing a constant ratio.

The circuitry in FIG. 13 has no floating node. Thus, the more stable circuit operation can be expected.

A plate voltage generation circuit according to a second modification of the first embodiment will now be described with reference to FIG. 14.

Figure 14:
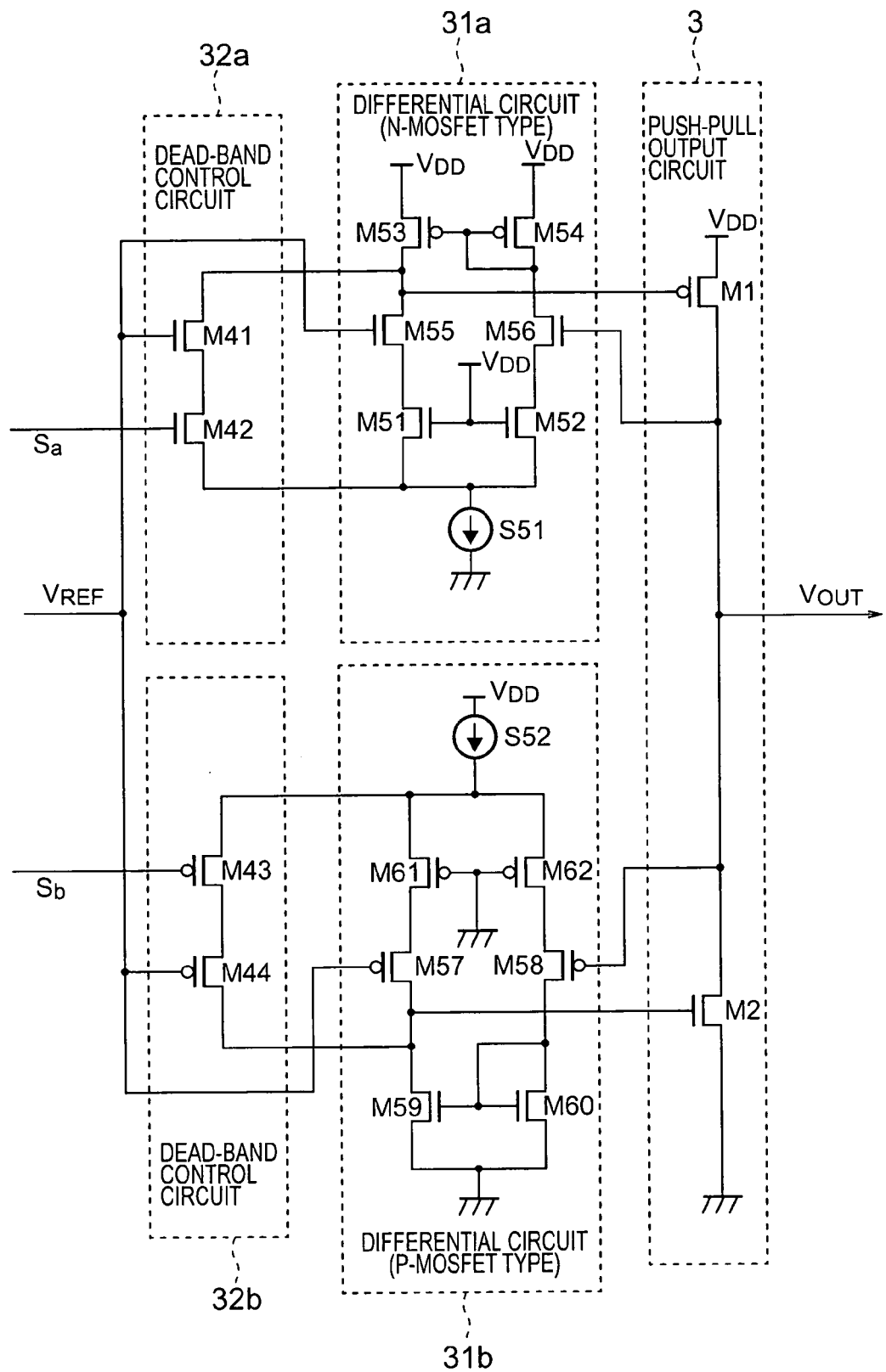
FIG. 14 is a diagram of a second modification of the first embodiment according to the present invention.

The plate voltage generation circuit in FIG. 14 differs from that in FIG. 13 in differential circuits. Differential circuits 31a and 31b in FIG. 14 will be described. The differential circuit 31a includes a current mirror circuit and a differential pair and further has a pair of MOS transistors arranged between the differential pair and a constant current source S51. The differential circuit 31b also includes a current mirror circuit and a differential pair and further has a pair of MOS transistors arranged between the differential pair and a constant current source S52.

The differential circuit 31a is an N-MOSFET type. The differential circuit 31a includes the same transistors as those of the differential circuit 21a in FIG. 13. In other words, the differential circuit 31a includes pMOS transistors M53 and M54 and nMOS transistors M55 and M56. The differential circuit 31a further has a pair of nMOS transistors M51 (seventeenth MOS transistor) and M52 (eighteenth MOS transistor). The nMOS transistors M51 and M52 are connected between the nMOS transistors M55 and M56 and the constant current source S51. The gates of the transistors M51 and M52 are connected to each other. The drains of the transistors M51 and M52 are also connected to each other. The source of the transistor M51 is connected to that of the transistor M55. The source of the transistor M52 is connected to that of the transistor M56. The respective gates of the transistors M51 and M52 are connected to the external power supply voltage $V_{DD}$ which is high potential.

The differential circuit 31b is a P-MOSFET type. The circuit 31b includes the same transistors as those of the differential circuit 21b in FIG. 13. In other words, the differential circuit 31b includes pMOS transistors M57 and M58 and nMOS transistors M59 and M60. The differential circuit 31a further has a pair of pMOS transistors M61 (nineteenth MOS transistor) and M62 (twentieth MOS transistor). The pMOS transistors M61 and M62 are connected between the pMOS transistors M57 and M58 and the constant current source S52. The gates of the transistors M61 and M62 are connected to each other and are also connected to the ground. The drains of the transistors M61 and M62 are connected to each other. The sources of the transistors M61 and M62 are connected to the drains of the transistors M57 and M58, respectively.

In the first modification of FIG. 13, the drains of the switching MOS transistors M42 and M43 in the dead-band control circuits 32a and 32b are connected to the differential circuits 21a and 21b, respectively. Accordingly, the plate voltage generation circuit has a structure that one stage of MOS transistors are added to the MOS transistors serving as the differential pair in each of the differential circuits 21a and 21b. The circuitry has to be designed in consideration of the above structure.

In the plate voltage generation circuit in FIG. 14, each differential circuit further includes the same stage of MOS transistors as that in the corresponding dead-band control circuit. Consequently, the circuitry can be designed aiming at the ratio of the sum of the constants of the right transistors to that of the left transistors in each of the differential circuits 31a and 31b during the operations of the dead-band control circuits 32a and 32b without considering the above-mentioned stage of MOS transistors. In other words, circuitry design can be easily made.

A plate voltage generation circuit according to a third modification of the first embodiment will now be described with reference to FIG. 15. The present plate voltage generation circuit includes dead-band control circuits on the input and output sides of the respective differential circuits 31a and 31b. In other words, the present plate voltage generation circuit includes seventh and eighth dead-band control circuits 32c and 32d corresponding to the fifth and sixth dead-band control circuits 32a and 32b in FIG. 14. The dead-band control circuit 32c includes an MOS transistor M45 (twenty-second MOS transistor) and an MOS transistor M46 (twenty-first MOS transistor). The dead-band control circuit 32c corresponds to the dead-band control circuit 32a including the MOS transistors M41 and M42. The dead-band control circuit 32d includes an MOS transistor M47 (twenty-third MOS transistor) and an MOS transistor M48 (twenty-fourth MOS transistor). The dead-band control circuit 32d corresponds to the dead-band control circuit 32b including the MOS transistors M43 and M44. The MOS transistors M45 and M48 can be called MOS transistors for changing a constant ratio.

Figure 15:
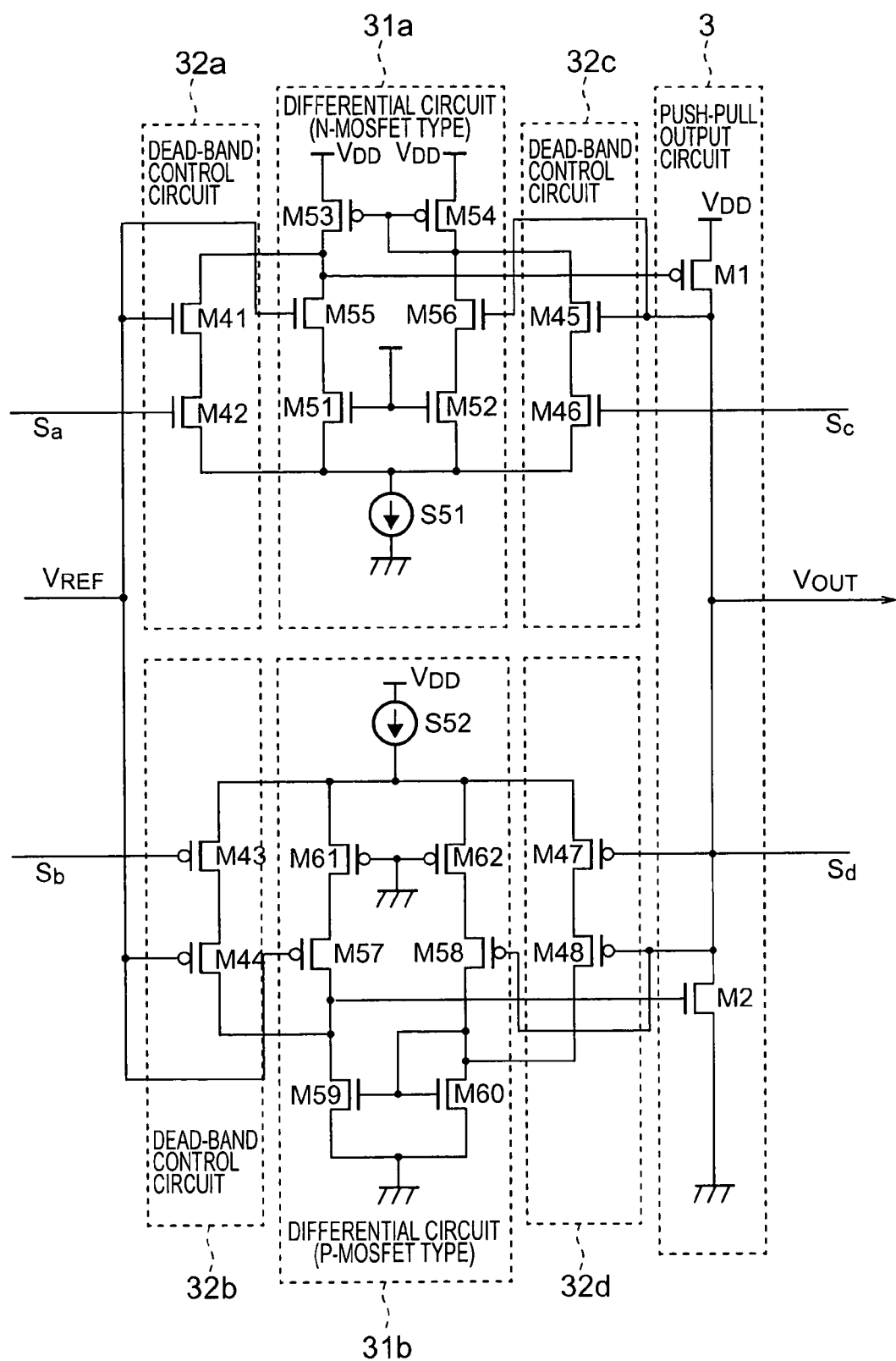
FIG. 15 is a diagram of a third modification of the third embodiment according to the present invention.

Referring to FIG. 15, the reference voltage $V_{REF}$ is supplied to the MOS transistors M41 and M44. The dead-band control signals Sa and Sb are supplied to the MOS transistors M42 and M43, respectively. The MOS transistors M41 and M42 are connected to the output side of the current mirror circuit in the differential circuit 31a and the MOS transistors M43 and M44 are connected to the output side of the current mirror circuit in the differential circuit 31b. On the other hand, the output voltage $V_{OUT}$ is applied to the MOS transistors M45 and M48. Third and fourth dead-band control signals Sc and Sd are supplied to the MOS transistors M46 and M47, respectively. The MOS transistors M45 and M46 are connected to the input side of the current mirror circuit in the differential circuit 31a and the MOS transistors M45 and M46 are connected to the input side of the current mirror circuit in the differential circuit 31b.

Figure 10:
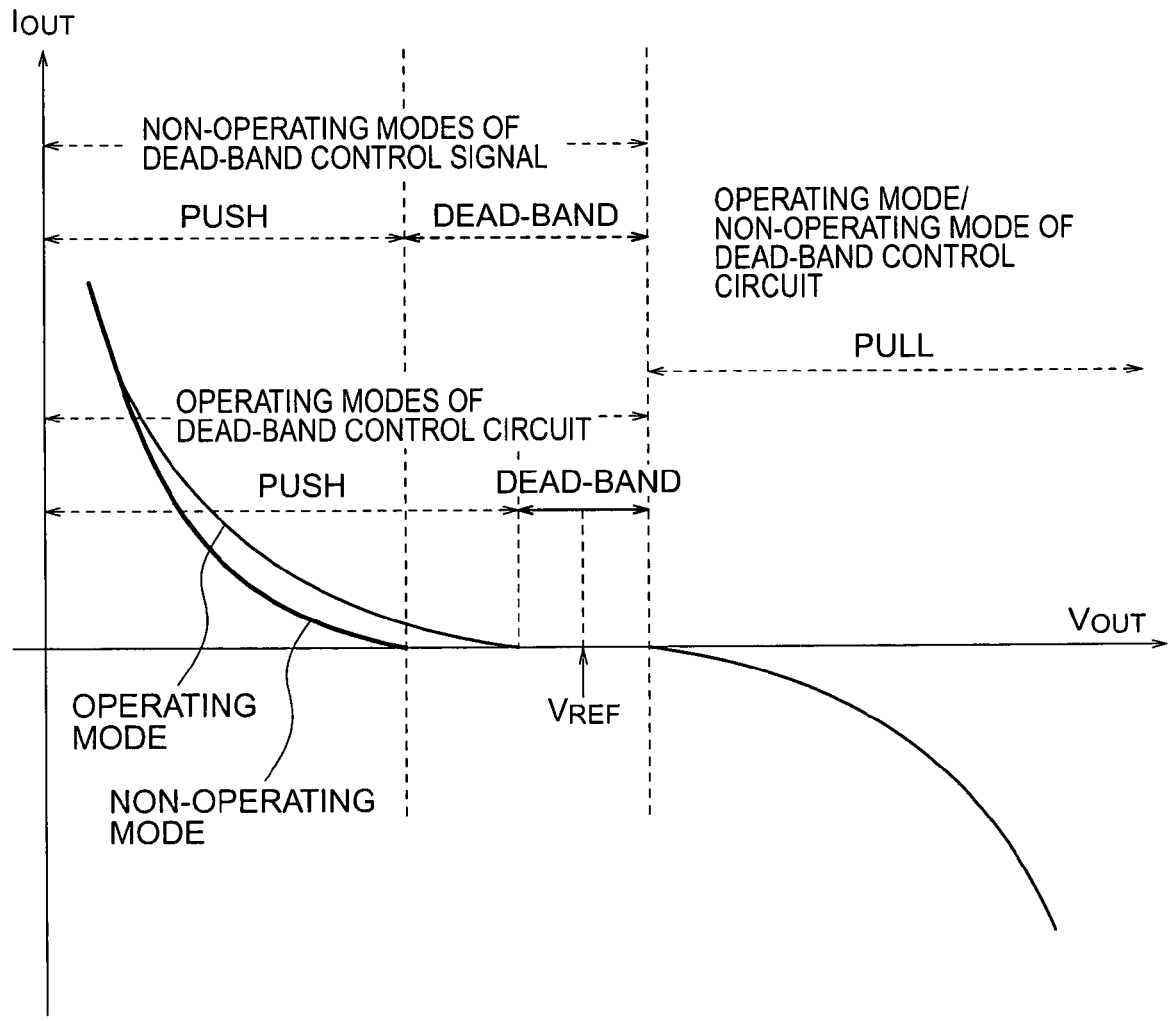
FIG. 10 is a waveform chart explaining an example the operating characteristic related to the widths of dead bands in the plate voltage generation circuit in FIG. 8.
Figure 16:
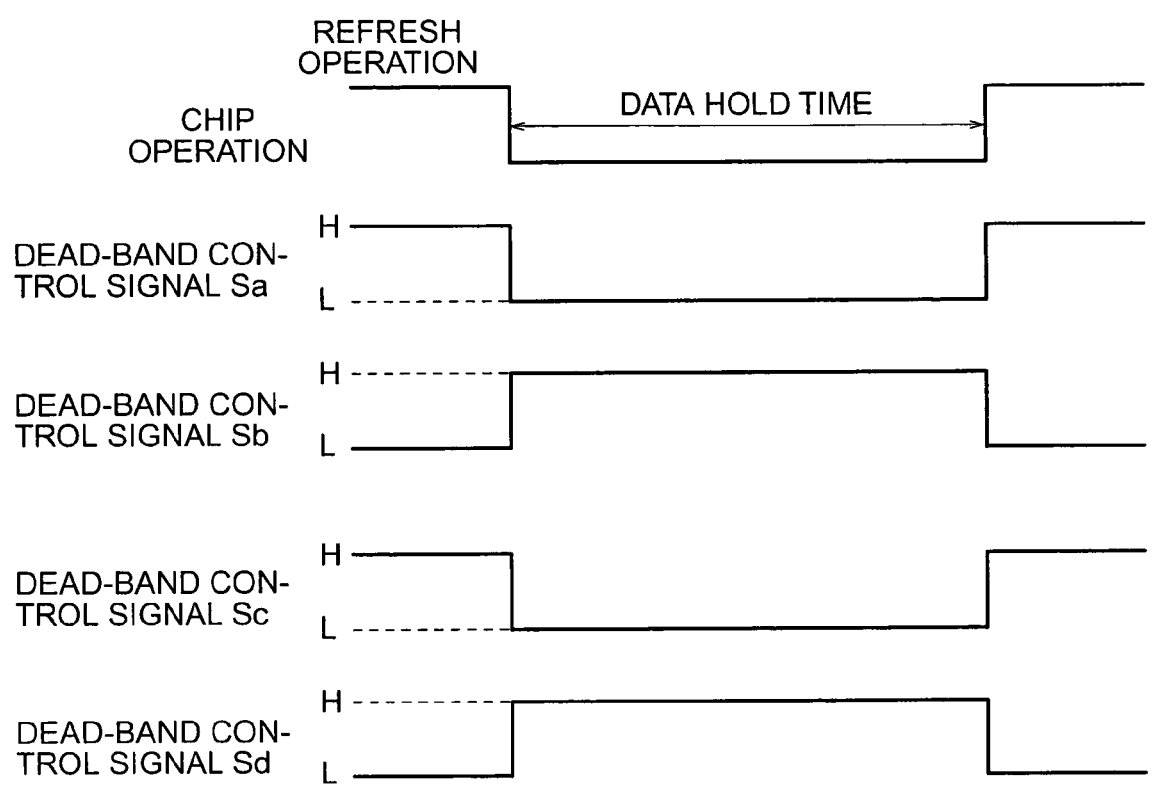
FIG. 16 is a waveform chart explaining an example of operating characteristic related to dead-band control signals in the plate voltage generation circuit in FIG. 15.
Figure 17:
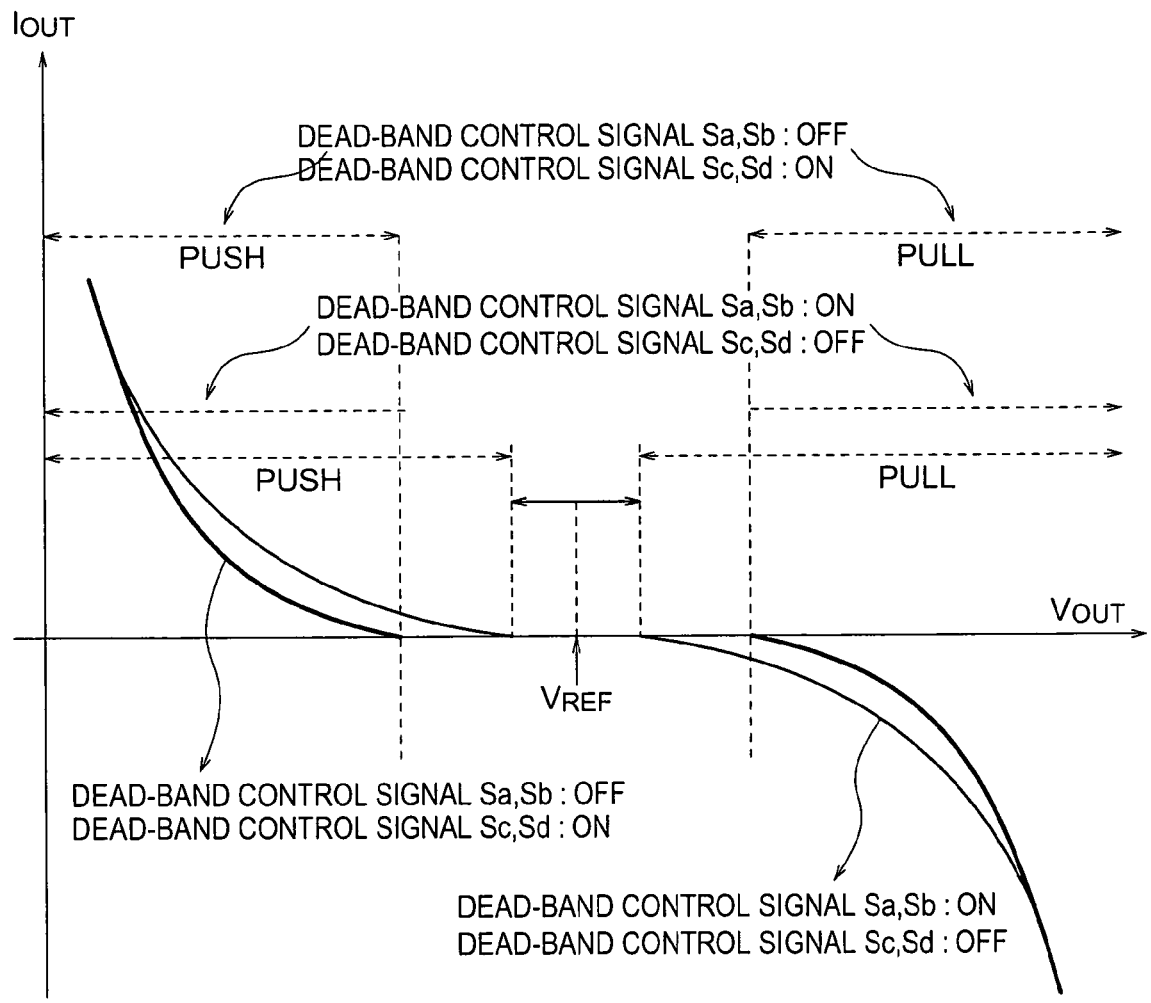
FIG. 17 is a waveform chart explaining an example of operating characteristic related to the widths of dead bands in the plate voltage generation circuit in FIG. 15.

In other words, referring to FIG. 16, the first to fourth dead-band control signals Sa to Sd are properly used together, so that the present circuit can provide the operating characteristics in FIGS. 7, 10, and 12. Further, the circuit can have operating characteristic in which the width of the dead band is reduced as shown in FIG. 17. If the width of the dead band is larger than a set value due to variations of device constants and a fluctuation in voltage increases, the present circuit can narrow the dead band to reduce the fluctuation in voltage. Thus, voltage supply and chip operation can be performed more stably.

The above description has been made with reference to the illustrated functional blocks. Variations in allocation by combining and/or separating functions can be freely made so long as the above-mentioned functions are realized. The present invention is not limited by the above description. Further, the present invention can be applied to general small stable plate voltage supply circuits.

As mentioned above, according to the present invention, at least one dead-band control circuit is added to the plate voltage generation circuit and at least one dead-band control signal is externally supplied to the dead-band control circuit so that the dead band can be controlled. Accordingly, when the setting of the dead-band control signal is changed, the width of the dead band of an output voltage can be easily changed. Thus, the operation and non-operation of the dead-band control circuit can be arbitrarily controlled in accordance with chip operation. In other words, the width of the dead band of the output voltage can be controlled at will in accordance with the chip operation.

Since the width of the dead band of the output voltage can be arbitrarily controlled in accordance with the chip operation, if the width of the dead band is set large, a through current generated in a push-pull output circuit can be reduced to the order of nanoamperes (nA) or lower. The through current of the order of nanoamperes (nA) does not affect current consumption. Alternatively, the occurrence of a through current can be prevented. In the operation such as refresh, current consumption is on the order of milliamperes (mA). A fluctuation in voltage in the refresh operation is generated earlier than that in data hold operation. The dead-band control circuit is controlled to reduce the width of the dead band and increase a response speed of the voltage generation circuit against the fluctuation in voltage. Thus, stable voltage supply can be performed. Therefore, the plate voltage generation circuit of the present invention can realize a suppression in through current and achieve a response speed, the suppression therein and the response speed being equivalent to those in the known circuit.

Further, the plate voltage generation circuit according to the present invention can be accomplished by adding at least one dead-band control circuit to the plate voltage generation circuit. Accordingly, when the dead-band control circuits are operating or not operating, there is no difference in voltage supply capability between the present plate voltage generation circuit and the known circuit. In addition, the layout area of the present circuit is smaller than arranging voltage generation circuits having different dead band widths. For a reference voltage, one reference voltage is generated using a resistance type potential dividing circuit on the basis of, for example, an external voltage. The width of the dead band is controlled by the dead-band control circuit. Accordingly, the layout area for resistance to generate a reference voltage is smaller than that in Document 1 which discloses that the dead band is controlled using two or more reference voltages.

What is claimed is:

1. A plate voltage generation circuit comprising:
   a differential section including at least one differential pair of transistors to which a reference voltage and an output voltage are supplied, respectively;
   a push-pull output section, connected to the differential section, for generating the output voltage; and
   a dead-band control section, connected to the differential section, for changing the width of a dead band of the output voltage in accordance with a high level or a low level of at least one dead-band control signal externally supplied.

2. The plate voltage generation circuit according to claim 1, wherein the differential section includes a first differential circuit and a second differential circuit,
   the first differential circuit including:
   a first differential pair composed of a first MOS transistor receiving the reference voltage and a second MOS transistor receiving the output voltage;
   a first current mirror circuit connected between the first differential pair and a high potential side; and
   a first constant current source connected between the first differential pair and a low potential side,
   the second differential circuit including:
   a second differential pair composed of a third MOS transistor receiving the reference voltage and a fourth MOS transistor receiving the output voltage;
   a second constant current source connected between the second differential pair and the high potential side; and
   a second current mirror circuit connected between the second differential pair and the low potential side.

3. The plate voltage generation circuit according to claim 2, wherein
   the push-pull output section includes first and second output MOS transistors, connected in series between the high and low potential sides,
   the first output MOS transistor is connected to an output of the first differential circuit,
   the second output MOS transistor is connected to an output of the second differential circuit, and
   the output voltage is generated from the node between the first and second output MOS transistors.

4. The plate voltage generation circuit according to claim 3, wherein the dead-band control section includes an MOS transistor for switching and an MOS transistor for changing a constant ratio and is connected to at least one of the first and second differential circuits, the switching MOS transistor receiving the dead-band control signal, the constant-ratio changing MOS transistor receiving the reference voltage, the switching MOS transistor and the constant-ratio changing MOS transistor being connected in series.

5. The plate voltage generation circuit according to claim 4, wherein
   in the differential circuit connected to the dead-band control section, a first ratio is defined between the constants of the two transistors serving as the differential pair in the differential circuit,
   a second ratio is defined between the constant of one of the two transistors serving as the differential pair and the sum of the constant of the other transistor and that of the constant-ratio changing MOS transistor, and
   the first and second constant ratios are set so as to differ from each other.

6. The plate voltage generation circuit according to claim 5, wherein
   the dead-band control section includes a first dead-band control circuit connected to the first differential circuit and a second dead-band control circuit connected to the second differential circuit,
   the first dead-band control circuit includes a fifth MOS transistor for switching and a sixth MOS transistor connected in series to the fifth MOS transistor, the fifth MOS transistor receiving a first dead-band control signal, the sixth MOS transistor receiving the reference voltage, a series circuit composed of the fifth and sixth MOS transistors being connected in parallel to the second MOS transistor, and
   the second dead-band control circuit includes a seventh MOS transistor for switching and an eighth MOS transistor connected in series to the seventh MOS transistor, the seventh MOS transistor receiving a second dead-band control signal, the eighth MOS transistor receiving the reference voltage, a series circuit composed of the seventh and eighth MOS transistors being connected in parallel to the fourth MOS transistor.

7. The plate voltage generation circuit according to claim 5, wherein
the dead-band control section includes a third dead-band control circuit connected to the first differential circuit, and
the third dead-band control circuit includes a ninth MOS transistor for switching and a tenth MOS transistor connected in series to the ninth MOS transistor, the ninth MOS transistor receiving the first dead-band control signal, the tenth MOS transistor receiving the reference voltage, a series circuit composed of the ninth and tenth MOS transistors being connected in parallel to the first MOS transistor.

8. The plate voltage generation circuit according to claim 5, wherein
the dead-band control section includes a fourth dead-band control circuit connected to the second differential circuit, and
the fourth dead-band control circuit includes an eleventh MOS transistor for switching and a twelfth MOS transistor connected in series to the eleventh MOS transistor, the eleventh MOS transistor receiving the second dead-band control signal, the twelfth MOS transistor receiving the reference voltage, a series circuit composed of the eleventh and twelfth MOS transistors being connected in parallel to the third MOS transistor.

9. The plate voltage generation circuit according to claim 5, wherein
the dead-band control section includes a fifth dead-band control circuit connected to the first differential circuit and a sixth dead-band control circuit connected to the second differential circuit,
the fifth dead-band control circuit includes a thirteenth MOS transistor for switching and a fourteenth MOS transistor connected in series to the thirteenth MOS transistor, the thirteenth MOS transistor receiving the first dead-band control signal, the fourteenth MOS transistor receiving the reference voltage, a series circuit composed of the thirteenth and fourteenth MOS transistors being connected in parallel to the first MOS transistor, and
the sixth dead-band control circuit includes a fifteenth MOS transistor for switching and a sixteenth MOS transistor connected in series to the fifteenth MOS transistor, the fifteenth MOS transistor receiving the second dead-band control signal, the sixteenth MOS transistor receiving the reference voltage, a series circuit composed of the fifteenth and sixteenth MOS transistors being connected in parallel to the third MOS transistor.

10. The plate voltage generation circuit according to claim 9, wherein
the first differential circuit further includes a seventeenth MOS transistor and an eighteenth MOS transistor, the seventeenth MOS transistor being connected between the first MOS transistor and the first constant current source, the eighteenth MOS transistor being connected between the second MOS transistor and the first constant current source, the respective gates of the seventeenth and eighteenth MOS transistors being connected to each other and also being connected to the high potential side, the series circuit composed of the thirteenth and fourteenth MOS transistors being connected in parallel to a series circuit composed of the first and seventeenth MOS transistors, and
the second differential circuit further includes a nineteenth MOS transistor and a twentieth MOS transistor, the nineteenth MOS transistor being connected between the third MOS transistor and the second constant current source, the twentieth MOS transistor being connected between the fourth MOS transistor and the second constant current source, the respective gates of the nineteenth and twentieth MOS transistors being connected to each other and also being connected to the low potential side, the series circuit composed of the fifteenth and sixteenth MOS transistors being connected in parallel to a series circuit composed of the third and nineteenth MOS transistors.

11. The plate voltage generation circuit according to claim 10, wherein
the dead-band control section further includes a seventh dead-band control circuit and an eighth dead-band control circuit, the seventh dead band control circuit being connected to the first differential circuit, the eighth dead-band control circuit being connected to the second differential circuit,
the seventh dead-band control circuit includes a twenty-first MOS transistor for switching and a twenty-second MOS transistor connected in series to the twenty-first MOS transistor, the twenty-first MOS transistor receiving a third dead-band control signal, the twenty-second MOS transistor receiving the output voltage, a series circuit composed of the twenty-first and twenty-second MOS transistors being connected in parallel to a series circuit composed of the second and eighteenth MOS transistors,
the eighth dead-band control circuit includes a twenty-third MOS transistor for switching and a twenty-fourth MOS transistor connected in series to the twenty-third MOS transistor, the twenty-third MOS transistor receiving a fourth dead-band control signal, the twenty-fourth MOS transistor receiving the output voltage, a series circuit composed of the twenty-third and twenty-fourth MOS transistors being connected in parallel to a series circuit composed of the fourth and twentieth MOS transistors.

* * * * *